(12) United States Patent
Rybicki et al.

(10) Patent No.: US 11,490,487 B2
(45) Date of Patent: Nov. 1, 2022

(54) LIGHT EMITTING DIODE LIGHT STRUCTURES

(71) Applicant: Austin IP Partners, Austin, TX (US)

(72) Inventors: Mathew A. Rybicki, Leander, TX (US); Daniel Patrick Mulligan, Austin, TX (US)

(73) Assignee: Austin IP Partners, Austin, TX (US)

( * ) Notice: Subject to any disclaimer, the term of this patent is extended or adjusted under 35 U.S.C. 154(b) by 0 days.

(21) Appl. No.: 17/447,368

(22) Filed: Sep. 10, 2021

(65) Prior Publication Data

US 2022/0078896 A1 Mar. 10, 2022

Related U.S. Application Data

(63) Continuation of application No. 17/248,132, filed on Jan. 11, 2021, now Pat. No. 11,122,666, which is a
(Continued)

(51) Int. Cl.
| | |
|---|---|
| *H05B 45/50* | (2022.01) |
| *H05B 45/10* | (2020.01) |
| *H05B 45/40* | (2020.01) |
| *H05B 47/19* | (2020.01) |
| *H01L 25/075* | (2006.01) |
| *H01L 25/16* | (2006.01) |
| *H01L 27/02* | (2006.01) |

(Continued)

(52) U.S. Cl.
CPC ......... *H05B 45/50* (2020.01); *H01L 25/0753* (2013.01); *H01L 25/167* (2013.01); *H01L 27/0248* (2013.01); *H01L 33/62* (2013.01); *H05B 45/10* (2020.01); *H05B 45/40* (2020.01); *H05B 47/19* (2020.01); *F21K 9/238* (2016.08); *H01L 29/73* (2013.01); *H01L 2224/48137* (2013.01); *H01L 2224/49107* (2013.01); *Y02B 20/30* (2013.01)

(58) Field of Classification Search
CPC ...... H01L 2924/12044; H05B 33/0803; H05B 33/0896; H05B 45/50
See application file for complete search history.

(56) References Cited

U.S. PATENT DOCUMENTS

| | | |
|---|---|---|
| 5,495,147 A | 2/1996 | Lanzisera |
| 8,314,564 B2 * | 11/2012 | Yu .......................... H05B 45/37 315/185 S |

(Continued)

*Primary Examiner* — Adam D Houston
(74) *Attorney, Agent, or Firm* — Garlick & Markison; Bruce E. Garlick

(57) ABSTRACT

A Light Emitting Diode (LED) light includes a bridge rectifier configured to be powered by an alternating current power source and to produce a rectified output. Control circuitry couples to the bridge rectifier and is configured to produce a shunt signal when the rectified output is less than a threshold voltage. A series connected Light Emitting Diode (LED) string includes a first group of LEDs and a second group of LEDs. A switch couples to a first side of the second group of LEDs and is controlled by the shunt signal to deactivate the second group of LEDs. The control circuitry may include a ratio metric series resistor string configured to sense a proportion of the rectified output and an inverter configured to generate the shunt signal based on the proportion of the rectified output.

20 Claims, 45 Drawing Sheets

Related U.S. Application Data continuation of application No. 16/663,846, filed on Oct. 25, 2019, now Pat. No. 10,893,586, which is a continuation of application No. 16/035,852, filed on Jul. 16, 2018, now Pat. No. 10,462,864, which is a continuation of application No. 15/795,965, filed on Oct. 27, 2017, now Pat. No. 10,028,349, which is a continuation of application No. 15/264,475, filed on Sep. 13, 2016, now Pat. No. 9,807,836, which is a continuation of application No. 14/145,271, filed on Dec. 31, 2013, now Pat. No. 9,468,062.

(60) Provisional application No. 61/748,306, filed on Jan. 2, 2013.

(51) Int. Cl.
*H01L 33/62* (2010.01)
*F21K 9/238* (2016.01)
*H01L 29/73* (2006.01)

(56) References Cited

U.S. PATENT DOCUMENTS

| | | | | |
|---|---|---|---|---|
| 8,624,520 B2* | 1/2014 | Schlenk | H05B 45/3725 | 315/276 |
| 9,247,603 B2* | 1/2016 | Grajcar | H05B 45/397 | |
| 9,468,062 B2* | 10/2016 | Rybicki | H05B 45/10 | |
| 9,713,211 B2 | 7/2017 | Van De Ven | | |
| 9,756,696 B1 | 9/2017 | Bradford | | |
| 9,854,631 B2* | 12/2017 | Akiyama | H05B 45/46 | |
| 9,871,404 B2 | 1/2018 | McBryde et al. | | |
| 10,091,842 B2* | 10/2018 | Miskin | H05B 45/42 | |
| 10,154,551 B2* | 12/2018 | Miskin | H05B 45/42 | |
| 10,560,990 B1 | 2/2020 | Fragiacomo et al. | | |
| 2004/0021578 A1* | 2/2004 | Hudson | G01R 19/165 | 324/500 |
| 2008/0116816 A1* | 5/2008 | Neuman | F21S 4/10 | 315/185 S |
| 2010/0123403 A1* | 5/2010 | Reed | H05B 45/48 | 315/193 |
| 2010/0271802 A1* | 10/2010 | Recker | H05B 45/12 | 362/20 |
| 2011/0057572 A1 | 3/2011 | Kit et al. | | |
| 2011/0227489 A1* | 9/2011 | Huynh | H05B 45/30 | 315/185 R |
| 2012/0200229 A1* | 8/2012 | Kunst | H05B 45/385 | 315/186 |
| 2013/0026925 A1* | 1/2013 | Ven | H05B 45/44 | 315/122 |
| 2013/0147397 A1 | 6/2013 | McBryde et al. | | |
| 2013/0234609 A1* | 9/2013 | Akiyama | H05B 45/40 | 315/185 R |
| 2013/0307424 A1* | 11/2013 | Gray | H05B 45/48 | 315/193 |
| 2014/0055032 A1* | 2/2014 | Keller | H05B 45/48 | 362/249.02 |
| 2014/0111090 A1* | 4/2014 | Zhang | H05B 45/44 | 315/193 |
| 2014/0132164 A1 | 5/2014 | McBryde et al. | | |
| 2014/0184080 A1* | 7/2014 | Rybicki | H01L 25/167 | 315/122 |
| 2014/0339994 A1* | 11/2014 | Zanotto | H05B 45/48 | 315/193 |
| 2014/0361695 A1* | 12/2014 | Akiyama | H05B 45/48 | 315/185 R |
| 2014/0361696 A1* | 12/2014 | Siessegger | H05B 45/395 | 315/193 |
| 2015/0015145 A1 | 1/2015 | Carrigan et al. | | |
| 2015/0035443 A1 | 2/2015 | Hill et al. | | |
| 2015/0061521 A1 | 3/2015 | Cohen | | |
| 2015/0115824 A1 | 4/2015 | Lee | | |
| 2015/0137688 A1* | 5/2015 | Gibbs | H05B 47/24 | 315/186 |
| 2015/0137693 A1 | 5/2015 | Reed | | |
| 2015/0230309 A1* | 8/2015 | Grajcar | A01K 45/00 | 315/192 |
| 2015/0257225 A1* | 9/2015 | Yu | H05B 45/46 | 315/122 |
| 2015/0271882 A1* | 9/2015 | Melanson | H05B 45/3725 | 315/186 |
| 2015/0312983 A1 | 10/2015 | Hu et al. | | |
| 2015/0312987 A1* | 10/2015 | Gibbs | H05B 45/345 | 315/122 |
| 2015/0351169 A1* | 12/2015 | Pope | H05B 45/325 | 315/193 |
| 2015/0351171 A1* | 12/2015 | Tao | F21V 23/005 | 315/185 R |
| 2015/0373811 A1* | 12/2015 | Dunser | H05B 47/185 | 324/414 |
| 2016/0029451 A1* | 1/2016 | Schijffelen | H05B 45/38 | 315/193 |
| 2016/0088704 A1 | 3/2016 | Lenk | | |
| 2016/0091147 A1 | 3/2016 | Jiang | | |
| 2016/0135261 A1* | 5/2016 | Chen | H05B 45/44 | 315/191 |
| 2016/0219672 A1 | 7/2016 | Liu | | |
| 2016/0278171 A1* | 9/2016 | Jermyn | H05B 45/10 | |
| 2016/0374166 A1* | 12/2016 | Chen | H05B 45/48 | |
| 2016/0381760 A1 | 12/2016 | Xiong | | |
| 2017/0086265 A1* | 3/2017 | Akiyama | H05B 45/46 | |
| 2017/0089525 A1 | 3/2017 | Xiong | | |
| 2017/0102114 A1 | 4/2017 | Xiong | | |
| 2017/0111963 A1* | 4/2017 | Kovatchev | H05B 45/54 | |
| 2017/0196051 A1* | 7/2017 | Lena | H05B 45/10 | |
| 2017/0202061 A1* | 7/2017 | Allen | F21V 23/06 | |
| 2017/0290119 A1 | 10/2017 | Xiong | | |
| 2017/0311395 A1* | 10/2017 | Wu | H05B 45/44 | |
| 2017/0311398 A1 | 10/2017 | Jiang | | |
| 2017/0321849 A1 | 11/2017 | Xiong | | |
| 2017/0347423 A1 | 11/2017 | Xiong | | |
| 2018/0049289 A1* | 2/2018 | Rybicki | H05B 47/19 | |
| 2018/0092168 A1* | 3/2018 | Lena | H05K 999/99 | |
| 2018/0168009 A1* | 6/2018 | Bobbo | H05K 1/181 | |
| 2018/0213620 A1* | 7/2018 | Lin | H05B 45/48 | |
| 2018/0295687 A1* | 10/2018 | Shackle | H05B 45/395 | |
| 2018/0310374 A1* | 10/2018 | He | H05B 45/50 | |
| 2019/0320515 A1* | 10/2019 | Sadwick | H05B 45/37 | |
| 2019/0394858 A1* | 12/2019 | Lal | H05B 47/175 | |
| 2020/0037409 A1* | 1/2020 | Peeters | H05B 45/00 | |
| 2020/0077499 A1* | 3/2020 | Shin | H05B 47/20 | |
| 2020/0263844 A1* | 8/2020 | Palfreyman | H05B 45/10 | |

\* cited by examiner

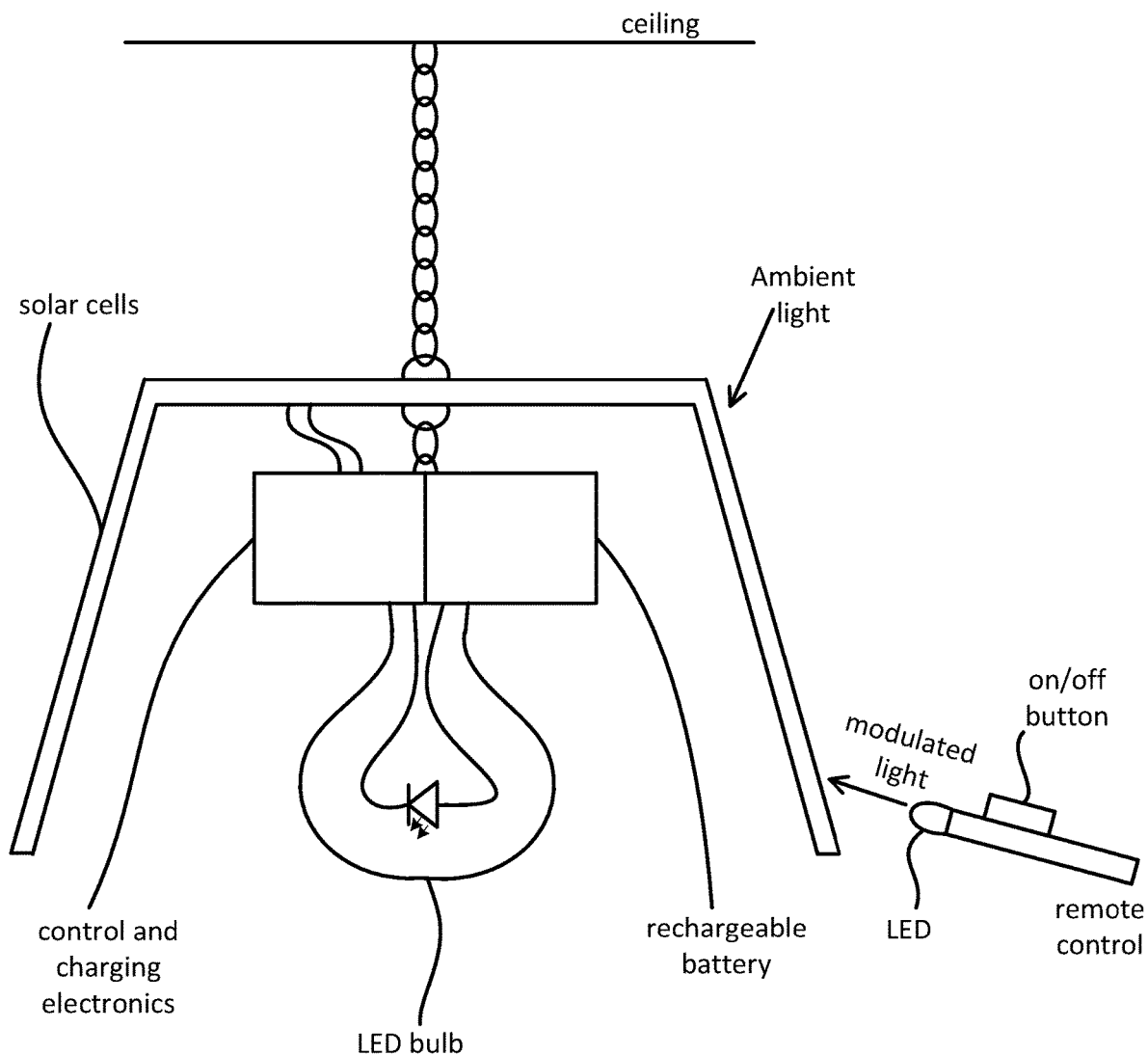
FIG. 16F1

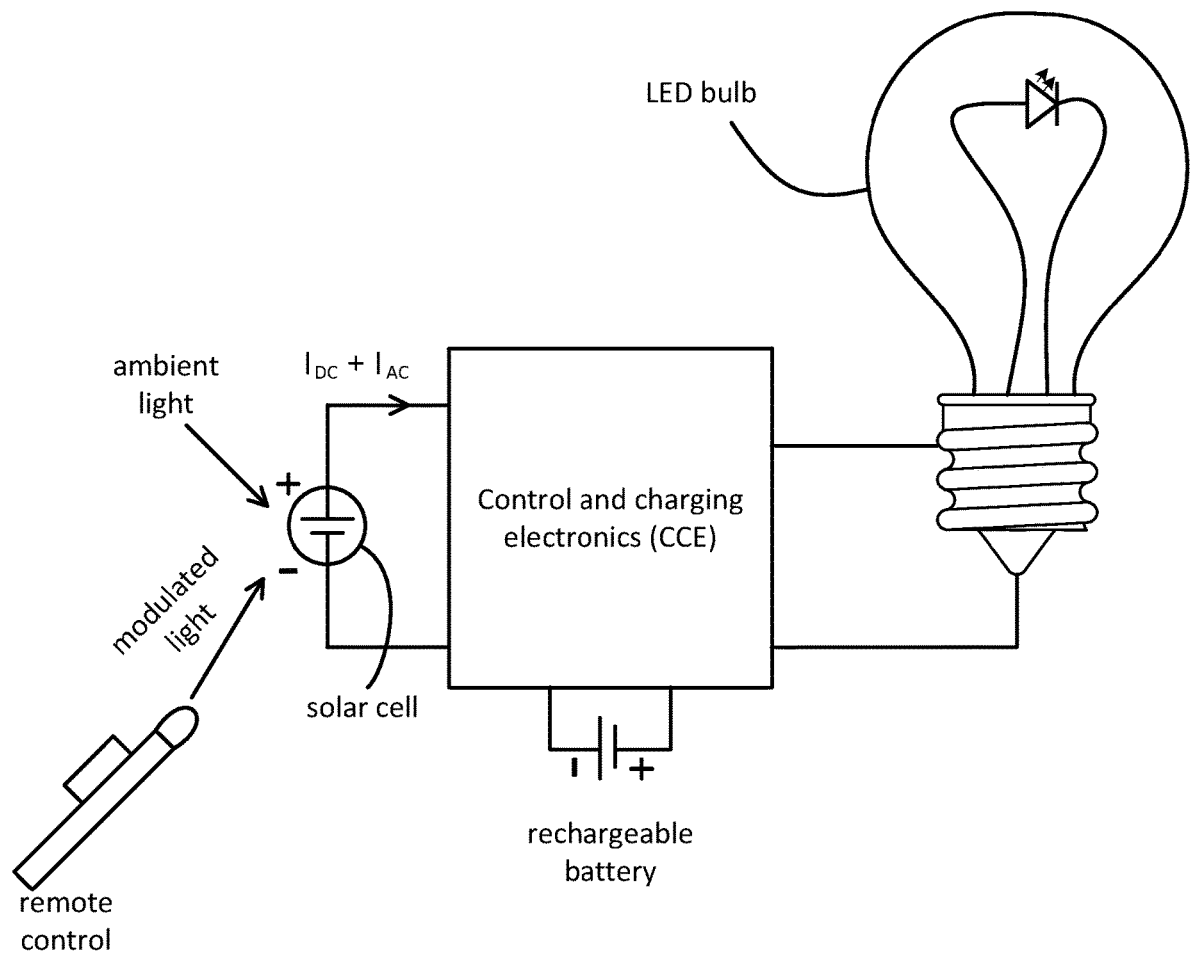
FIG. 16F2

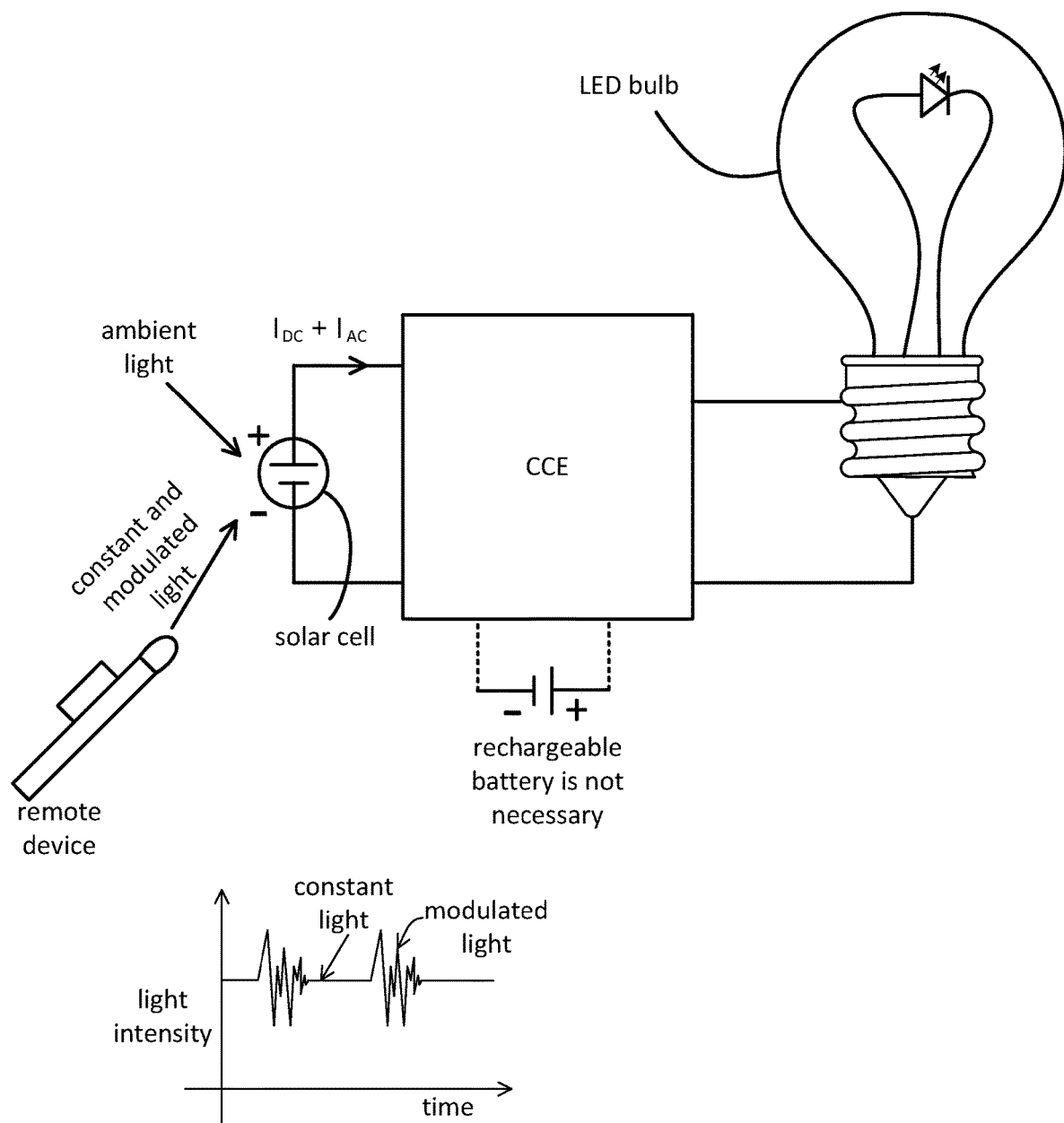
FIG. 16F3

LIGHT EMITTING DIODE LIGHT STRUCTURES

CROSS-REFERENCE TO PRIORITY APPLICATION

The present U.S. Utility patent application claims priority pursuant to 35 U.S.C. § 120 as a continuation of U.S. Utility application Ser. No. 17/248,132, entitled "LIGHT EMITTING DIODE LIGHT STRUCTURES", filed Jan. 11, 2021, which is a continuation of U.S. Utility application Ser. No. 16/663,846, entitled "LIGHT EMITTING DIODE LIGHT STRUCTURES", filed Oct. 25, 2019, now U.S. Pat. No. 10,893,586 issued on Jan. 12, 2021, which is a continuation of U.S. Utility application Ser. No. 16/035,852, entitled "LIGHT EMITTING DIODE LIGHT STRUCTURES", filed Jul. 16, 2018, now U.S. Pat. No. 10,462,864 issued on Oct. 29, 2019, which is a continuation of U.S. Utility application Ser. No. 15/795,965, entitled "LIGHT EMITTING DIODE LIGHT STRUCTURES", filed Oct. 27, 2017, now U.S. Pat. No. 10,028,349 issued on Jul. 17, 2018, which is a continuation of U.S. Utility application Ser. No. 15/264,475, entitled "LIGHT EMITTING DIODE LIGHT STRUCTURES", filed Sep. 13, 2016, now U.S. Pat. No. 9,807,836 issued on Oct. 31, 2017, which is a continuation of U.S. Utility application Ser. No. 14/145,271, entitled "LIGHT EMITTING DIODE LIGHT STRUCTURES", filed Dec. 31, 2013, now U.S. Pat. No. 9,468,062 issued on Oct. 11, 2016, which claims priority under 35 U.S.C. § 119(e) to U.S. Provisional Application Ser. No. 61/748,306, entitled "LIGHT EMITTING DIODE LIGHT STRUCTURES", filed Jan. 2, 2013, all of which are hereby incorporated herein by reference in their entirety and made part of the present U.S. Utility patent application for all purposes.

BACKGROUND OF THE INVENTION

1. Field of the Invention

The present invention relates to Light Emitting Diode (LED) lighting, and more particularly to circuitry for driving LED lighting and LED lighting containing such circuitry.

2. Description of the Related Art

Electrical lighting is widely used all around the world, and has been for close to a century. For most of this time, the dominant form of electrical lighting has been incandescent light bulbs. However other forms of light bulbs are becoming more popular in recent years.

Incandescent light bulbs pass an electrical current through a wire (called the filament) which causes the wire to heat up until it becomes white hot and emits light. Incandescent light bulbs are cheap, reliable, and very widely used, however most of the energy that they consume is emitted as waste heat rather than as useful light. Mainly because of this waste heat, the majority of the energy consumed by an incandescent light bulb is wasted, and the efficiency of incandescent light bulbs is typically as low as 2%-3%.

Compact fluorescent light bulbs (also known as CFL bulbs) use a fluorescent tube which is folded to fit in the space of an incandescent light bulb, allowing the use of a CFL light bulb in place of an incandescent light bulb. The fluorescent tube generates light through gas discharge by using electricity to excite a mercury vapor, which then emits ultraviolet light, which in turn is converted to visible light by a phosphor that coats the inside of the tube. CFL light bulbs are significantly more efficient than incandescent light bulbs, with typical efficiencies of 10% or so.

Unfortunately, CFL light bulbs are more complicated to manufacture than incandescent light bulbs, as they require a ballast to limit the current in the fluorescent tube after startup. Also, dimmer switches are commonly used with light bulbs, and CFL light bulbs are not very compatible with dimmer switches. Complications such as these make the manufacture of CFL light bulbs more expensive than incandescent bulbs—typically a CFL light bulb will cost several times more than an incandescent light bulb with the same level of light output. Finally, CFL light bulbs contain small amounts of mercury which is hazardous to humans and which makes it more difficult to dispose of them safely.

Light Emitting Diode light bulbs (also known as LED light bulbs) are even better than CFL light bulbs. The LEDs used in LED light bulbs are rapidly increasing in efficiency and light output, which allows LED light bulbs to get better over time. At typical efficiencies of 15% or so, LED light bulbs already offer higher efficiencies than CFL bulbs, and this efficiency advantage is expected to increase over time. Also, LED light bulbs do not contain hazardous materials, and are more flexible than CFL light bulbs. For example, LED light bulbs typically work better with dimmer switches which are commonly used by consumers.

Unfortunately, LED light bulbs are currently more expensive than CFL bulbs, and they are significantly more expensive than incandescent bulbs. Even with today's prices, the energy savings over a multi-year period of use is sufficient to justify the extra cost of LED light bulbs. This is especially true given that LED light bulbs typically have a longer lifetime than CFL bulbs, and a significantly longer lifetime than incandescent bulbs. The prices of LED bulbs are expected to decline in the future. As these prices decline, any remaining consumer resistance to using LED bulbs will reduce, and LED light bulbs are expected to become the dominant type of light bulb.

LED light bulbs use light emitting diodes (commonly referred to as LEDs) to generate light. LEDs operate by running electrical current through a forward biased diode junction which then emits monochromatic photons of light. These monochromatic photons are then converted to broad spectrum white light by use of a phosphor. The LEDs typically need to be supplied with a voltage in the region of 3.5V or so. In order to maximize the light output from the LED, and minimize flicker in the resulting light output, it is normal to drive the LED with a constant direct current (DC). It is also possible to use multiple colors of LEDs (typically red, green, and blue LEDs) to generate a broad spectrum of light without the use of a phosphor, although this is not common.

The light emitted by an LED is much more strongly correlated with the current flowing through the LED than with the voltage dropped across the LED. In order to more closely match the light output from multiple LEDs, it is more effective to match the current provided to each LED than to match the voltage provided to each LED. Therefore, it is preferred to connect several LEDs into a series configuration (an LED "string" as shown in item 110 in FIG. 1) than to connect several LEDs in parallel (as shown in item 120 in FIG. 1). An additional benefit of connecting LEDs in series is that the driving voltage is higher (Nx~3.5V, where N is the number of LEDs in series), and the total driving currents are lower, thereby allowing for a more efficient design for the driving circuit.

The power supply for an LED light bulb is typically an alternating current (AC) voltage from a power mains supply.

In various parts of the world this supply will be a sine wave with a voltage of 120V RMS (which is equal to 170V peak, or 340V peak-to-peak) or 240V RMS (which is equal to 340V peak, or 680V peak-to-peak), and a frequency of approximately 50 Hz or 60 Hz. The LED light bulb takes energy from this AC supply, and converts it to a form that is suitable for the LEDs to consume.

Additionally, the LED light bulb will need to have a power factor (PF) of close to 1.0, which means that the current taken from the mains supply should be in direct proportion to the voltage of that supply. Expressed another way, this means that the LED light bulb should present a purely resistive load to the mains supply.

This requirement significantly complicates the design of an LED light bulb. If an LED light bulb has a PF of 1.0, then the energy taken from the mains supply will mostly be concentrated into short periods aligned with the peaks of the voltage from the mains supply (item 210 in FIG. 2), but the energy consumed by the LEDs will ideally be at a constant level (item 220 in FIG. 2). Achieving this requires energy storage for short periods of time inside the LED light bulb.

One other important metric of the performance of light bulbs is flicker, which is the variation in the light output from the light bulb over short periods of time. The human visual system is not especially sensitive to flicker above about 20 Hz, as evidenced by the fact that video displays often display video content with a 24 Hz frame rate, at which point most people cannot visually detect that the display is flickering, although displays often operate at multiples of this frequency in order to make flickering even less apparent. At lower frequencies however, say 10-15 Hz, flicker becomes very detectable (and annoying) for the human visual system, and has been known to cause health effects in some cases.

Incandescent light bulbs do not demonstrate significant flicker. The energy supplied to the light bulb by an AC supply occurs primarily concentrated in short bursts corresponding to the peaks of the AC voltage, however the filament retains heat for a long enough period that it smoothens out these peaks to generate light at an almost constant level.

CFL light bulbs also do well with flicker management, because the phosphor demonstrates something called phosphor persistence, where the monochromatic photons of light absorbed by the phosphor are emitted as broad spectrum light after a random delay, leading to a smoothing effect on the level of light output and reducing flicker. Since LED lights use a similar approach with a phosphor converting a monochromatic photon source into broad spectrum light, their phosphor has a similar flicker smoothing effect.

A challenge with LED light bulbs today is heat dissipation. Incandescent light bulbs emit a large percentage of the energy they consume as waste heat, however most of the waste heat is emitted as infra-red light, and they do not contain any especially heat sensitive components, so they do not require specialized heat handling features. Per unit of useful light emitted, LED light bulbs waste less energy as heat; however most of this heat is not radiated and needs to be conducted away from the LEDs using a heat sink. Because of this, LED light bulbs are typically dominated by their heat sinks, and this contributes a significant proportion of the manufacturing cost of a current LED light bulb.

The performance of LEDs is getting better, and the amount of light that they output per unit of energy consumed is going up. Current lab designs of LEDs emit as much as 2× more lumens of light per watt than the LEDs typically used in current production LED light bulbs. When these LEDs are used in production products, their 2× higher light output will mean that they generate less waste heat per LED, but more importantly, their higher light output will mean that only half as many LEDs are required for the same level of light output. Thus, a 2× improvement in light output per watt consumed will result in an approximately 3× decrease in waste heat per LED light bulb.

Improvements in this area will have a large impact in the heat dissipation required in LED light bulbs. As the efficiency of the LEDs themselves continues to improve, this heat dissipation problem will become much less severe, and the need for extensive heat handling will become much less significant.

The other remaining problem with current LED light bulbs is that they require power conversion electronics to convert the power supplied by the mains connection to a form that can be used by the LEDs themselves. The LED electronics also are responsible for managing other functions, such as managing the power conversion electronics to keep the power factor as high as possible, adjusting the light output of the LEDs based on the operation of a dimmer switch, adjusting the light output of the LEDs to account for aging and temperature effects, and other functions. The LED electronics add cost and size to LED light bulbs. They also contribute to waste heat when the power conversion electronics don't convert energy with perfect efficiency.

BRIEF DESCRIPTION OF THE SEVERAL VIEWS OF THE DRAWINGS

FIG. 16F1 illustrates a ceiling mounted LED light constructed according to an embodiment of the present invention with a remote control;

FIG. 16F2 illustrates an LED light constructed according to an embodiment of the present invention with a remote control;

FIG. 16F3 illustrates an LED light constructed according to another embodiment of the present invention with a remote control;

DETAILED DESCRIPTION

Figure 3:
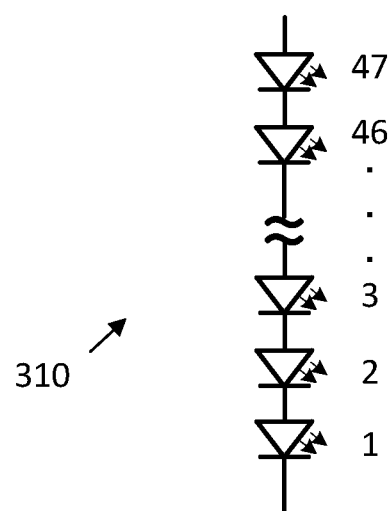
FIG. 3 illustrates an LED string having a plurality of series connected LEDs.

According to one or more aspects of the present invention, an LED light bulb includes improved power conversion electronics. The power conversion electronics service an LED string 310 as illustrated in FIG. 3 and its operation depends on the AC peak voltage, and includes enough LEDs so that all the LEDs are fully turned on and outputting light at their peak value when the AC input voltage is at its peak value. For example, with LEDs with a peak supply voltage of 3.6V, and a 120 Vrms AC supply (=120*2$^{0.5}$=169V peak), we will need 47 LEDs in the string.

Figure 4:
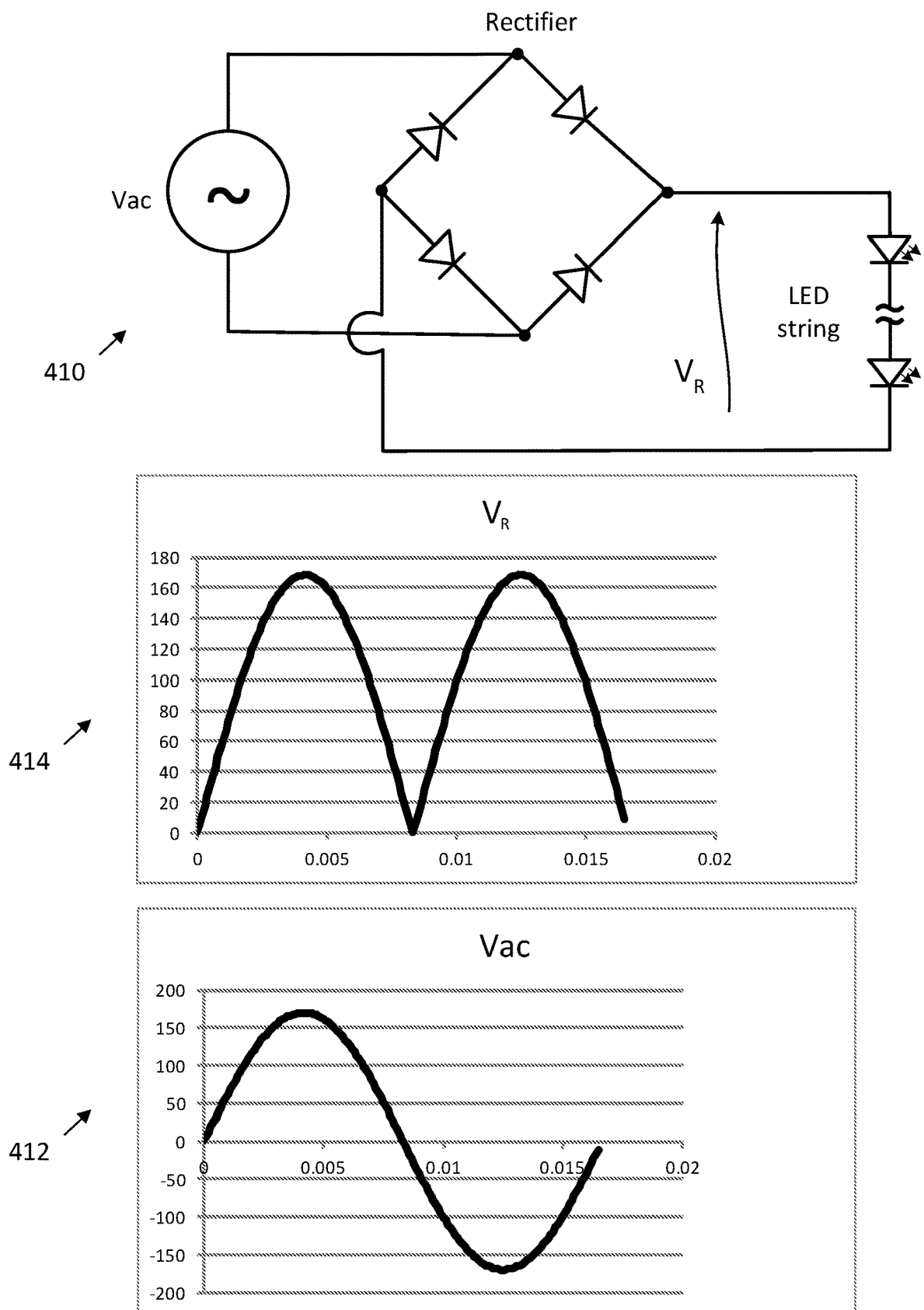
FIG. 4 illustrates an LED light driven by a full-wave rectified voltage along with graphs illustrating voltages driving the LED light.
Figure 5:
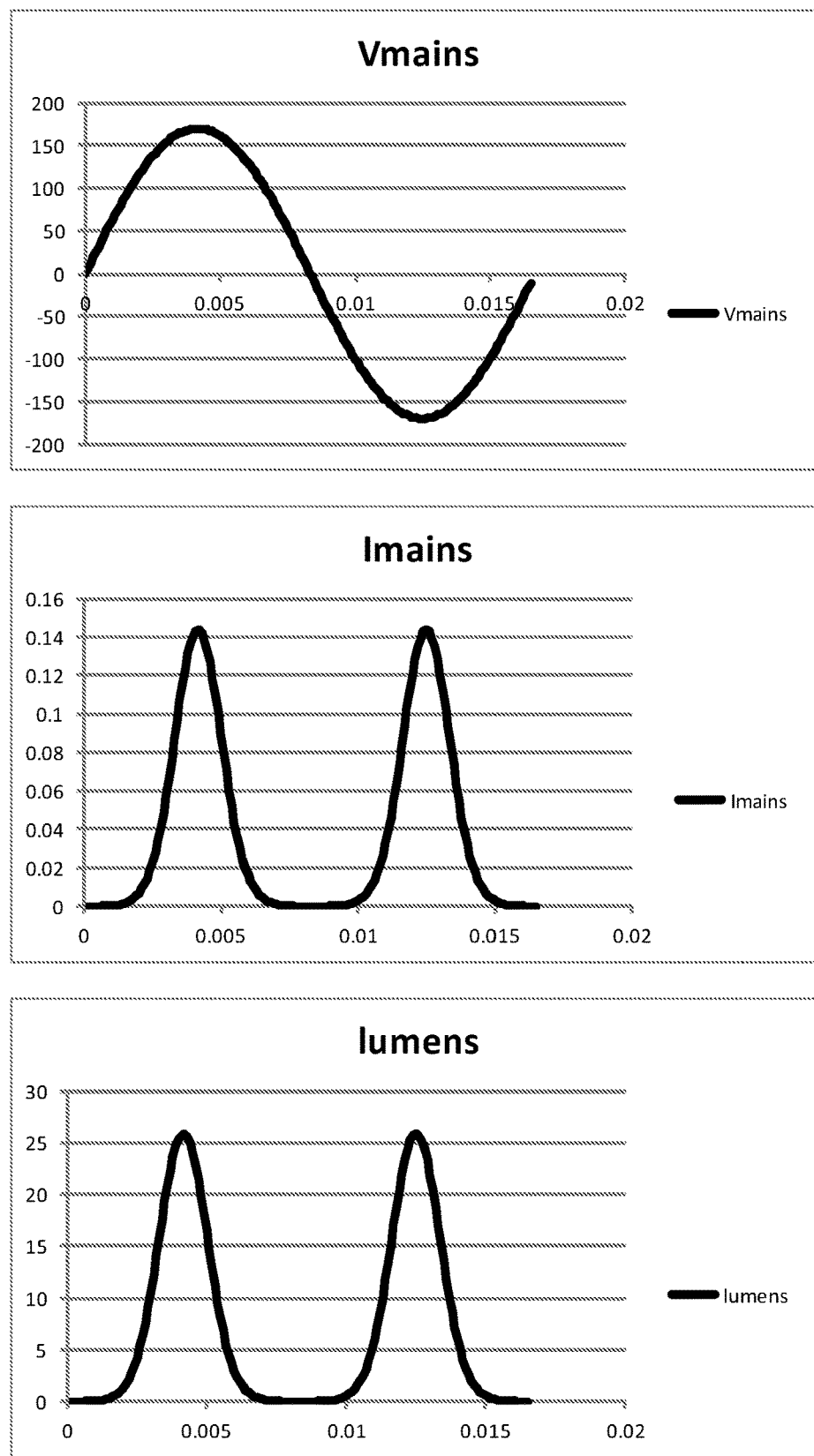
FIG. 5 illustrates voltage, current, and lumens graphs corresponding to the LED light of FIG. 4.

FIG. 4 illustrates an LED light driven by a full-wave rectified voltage along with graphs illustrating voltages driving the LED light. An LED light 410 built using a LED string is shown in FIG. 4, and the expected performance of such a light bulb is shown in FIG. 5. The AC voltage supply is shown at graph 412 of FIG. 4 and the rectified AC voltage is shown at 414 of FIG. 4. The AC voltage (Vmains), AC current (Imains), and lumens produced by the LED light bulb 410 are illustrated in FIG. 5.

Since there is a very non-linear relationship between the voltage across a LED and the light output, the light output from the LEDs will vary throughout the full cycle of the AC input voltage as show in FIG. 5. This leads to a flicker in the light output that happens at twice the frequency of the input AC supply (i.e. 100 Hz in areas with 50 Hz mains supply, 120 Hz in areas with 60 Hz mains supply), although the actual light output from the LED light bulb will be smoothed out quite a bit by the phosphor persistence of the phosphors used to convert the monochromatic photons from the LEDs to broad spectrum light from the LED light bulb.

There are two other major disadvantages to a LED string. First, the LEDs will be inactive for a significant proportion of the AC cycle, which means that the LEDs will operate with a large peak power to average power ratio. A higher peak to average power ratio may increase the cumulative power rating of all of the LEDs needed in an LED light bulb to achieve a certain level of light output. Second, the shape of the current waveform consumed by the LEDs will be quite far away from the ideal of a sine wave that is in phase with the AC voltage sine wave. This will lead to a sub-optimal power factor for an LED light bulb made with a LED string.

Figure 6:
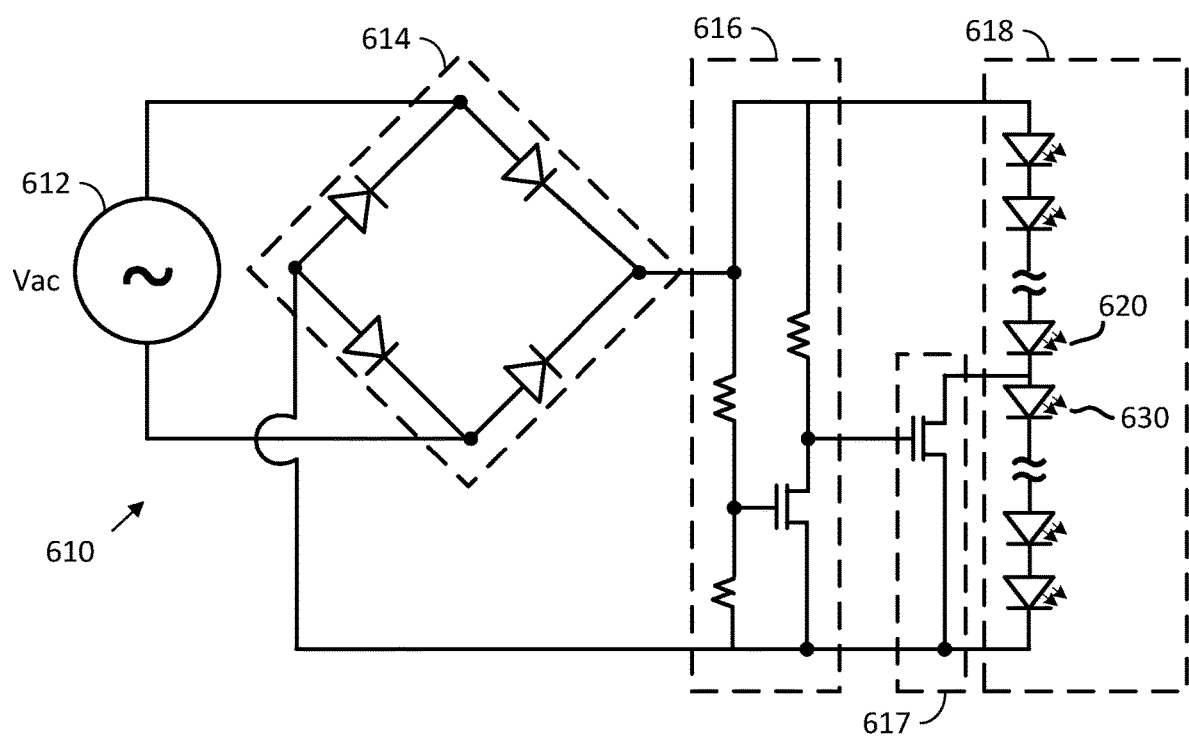
FIG. 6 illustrates an LED light contrasted according to one or more embodiments of the present invention.

FIG. 6 illustrates an LED light contrasted according to one or more embodiments of the present invention. It is possible to improve upon the performance of a LED string significantly with a circuit as shown in FIG. 6. The LED light 610 of FIG. 6 includes an AC power source 612, a bridge rectifier 614, a control circuitry 616, a switch 617, and a series connected LED string 618. The series connected LED string 618 includes a first group of LEDs including LED 620 and above and a second group of LEDs including LED 630 and below. The control circuitry 616 includes a ratio metric series resistor string and an inverter that, in operation, turn on the switch 617 when the voltage produced by the bridge rectifier 614 is below a threshold voltage and to turn off the switch 617 when the voltage produced by the bridge rectifier 614 is above the threshold voltage.

The bridge rectifier 614 is configured to be powered by an alternating current power source (AC power source 612) and to produce a rectified output. The control circuitry 616 couples to the bridge rectifier and is configured to produce a shunt signal when the rectified output is less than a threshold voltage. The series connected Light Emitting Diode (LED) string 630 includes a first group of LEDs (620 and above) and a second group of LEDs (630 and below). The switch 617 couples across the second group of LEDs and controlled by the shunt signal to deactivate the second group of LEDs.

In one embodiment, a number of the first group of LEDs is approximately equal to a number of the second group of LEDs. In another embodiment, a number of the first group of LEDs is greater than a number of the second group of LEDs. The first group of LEDs may include one or more than one LED. The second group of LEDs may include one or more than one LED.

The control circuitry 616 may include a ratio metric series resistor string configured to sense a proportion of the rectified output and an inverter configured to generate the shunt signal based on the proportion of the rectified output. The inverter may include a transistor configured to receive the proportion of the rectified output and a resistor coupled to the transistor and configured to generate the shunt signal based on the proportion of the rectified output.

The switch 617 may be a field effect transistor having gate configured to receive the shunt signal and a drain and source connected in shunt across the second group of LEDs. In another embodiment, the switch 617 may be a bipolar transistor having a base configured to receive the shunt signal and an emitter and collector connected in shunt across the second group of LEDs.

The control circuitry and switch are configured to effectively adjust the length of the LED string to short out every LED from device 630 and below in the LED string 618, during the part of the AC cycle when the supply voltage is less than the threshold voltage (which is equal to a portion of the peak voltage, e.g., 100%, 90%, 80%, 70%, 60%, etc.). This will allow the remaining LEDs in the LED string 618 to see higher voltages than they would otherwise see during this part of the AC cycle (with switching device 617 closed/transistor turned on), leading to higher levels of current and larger amounts of light output from these LEDs than would otherwise be the case without the LED string shortening circuit.

Teachings of the present invention address disadvantages of the LED string mentioned previously, among other disadvantages. Accordingly, the overall light output goes up, thereby improving the average to peak light output ratio. And two, the current waveform now allows greater amounts of current at periods where the LED string was previously not conducting current, improving the power factor.

For example, in one simulation, a LED string with 47 LEDs has a peak to average LED power ratio of 4.04 to 1, and a power factor of 81.58%. Because of the simplicity of the LED electronics, there is very little energy lost in power conversion, and 99.2% of all of the energy used by the LED light bulb will be consumed by the LEDs. It is true that a significant portion of the energy consumed by the LEDs will be wasted as heat, however this constraint is common to all possible designs of an LED light bulb.

The modified LED string circuit shown in FIG. 6 manages to improve on this performance significantly. If device 610 is configured to remove 8 LEDs from the string whenever the input voltage is below 145V, the peak to average LED power ratio improves to 3.30 to 1, and the power factor improves to 87.91%. The energy efficiency of this design continues to remain excellent, with 99.1% of the energy consumed by the LED light bulb being delivered to the LEDs.

Figure 7A:
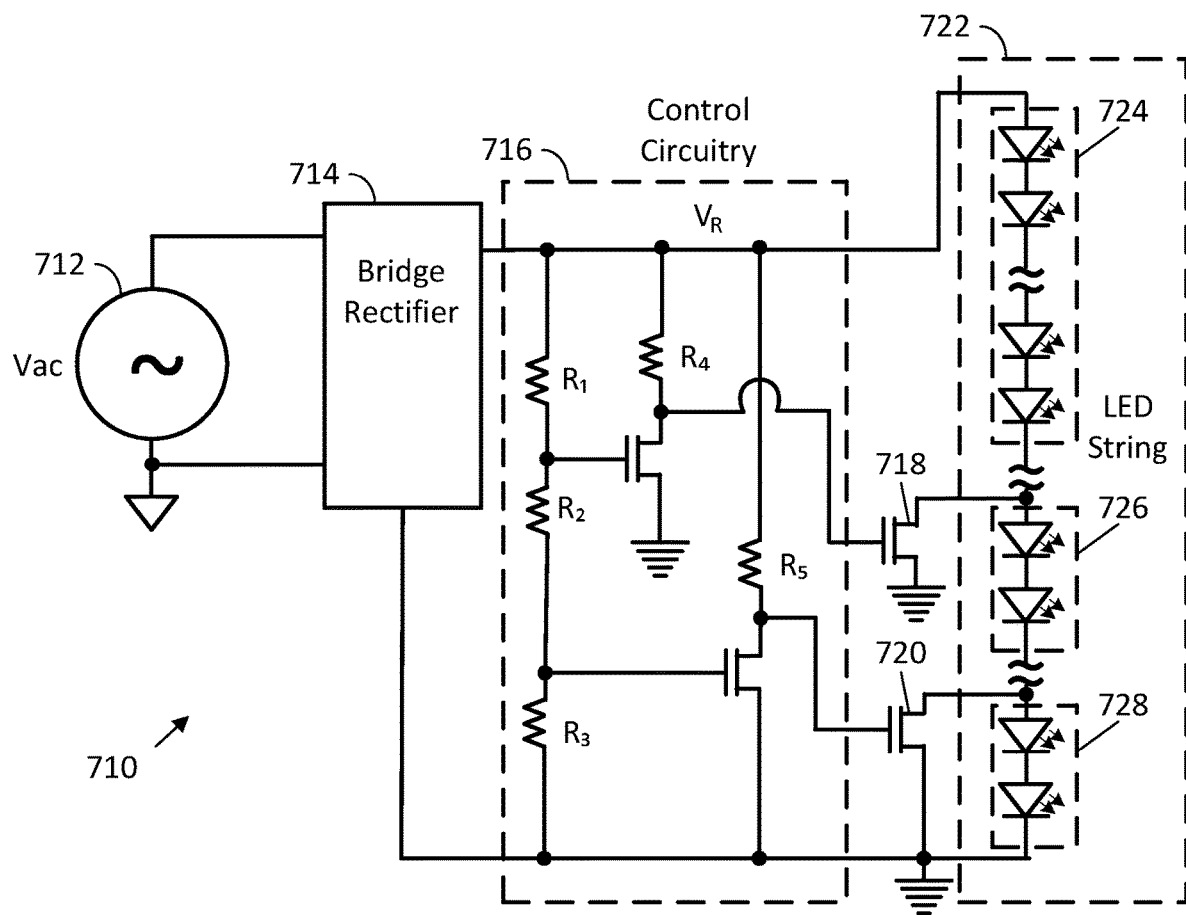
FIG. 7A illustrates an LED light constructed according to another embodiment of the present invention.

FIG. 7A illustrates an LED light constructed according to another embodiment of the present invention. It is possible to further improve upon the LED string design by adding additional tap points to allow more variation in the number of LEDs active in the LED string. FIG. 7 shows one such circuit 710. The device 710 of FIG. 7A includes a bridge rectifier 714 configured to be powered by an alternating current power source 712 and to produce a rectified output. The device 710 further includes control circuitry 716 coupled to the bridge rectifier 714, the control circuitry 716 configured to produce a first shunt signal to switch 718 based upon the rectified output and at least one first voltage threshold and to produce a second shunt signal to switch 720 based upon the rectified output and at least one second voltage threshold. A series connected Light Emitting Diode (LED) string 722 includes a first group of LEDs 724, a second group of LEDs 726, and a third group of LEDs 728. The first switch 718 couples to a first side of the second group of LEDs 726 and is controlled by the first shunt signal to deactivate the second group of LEDs 726. The second switch 720 couples to a first side of the third group of LEDs 728 and is controlled by the second shunt signal to deactivate the third group of LEDs 728.

If the circuit 710 in FIG. 7A is configured to remove 4 LEDs from the LED string when the voltage from the diode bridge is below 155V, and remove a further 4 when the voltage is below 140V, then the peak to average LED power ratio improves yet again to 3.01 to 1, and the power factor improves to 89.58%.

In alternate embodiment of FIG. 7A, switch 718, instead of shunting to ground, shuts across the second group of LEDs 726, such that when the switch is closed (transistor is turned on), the second group of LEDs 726 are disabled.

With one embodiment of the device 710 of FIG. 7A, a number of the second group of LEDs 726 is approximately equal to a number of the third group of LEDs 728. With another embodiment of the device of FIG. 7A, a number of the first group of LEDs is greater than a number of the second group of LEDs. The first group of LEDs may include one or more than one LED. The second group of LEDs may include one or more than one LED. The third group of LEDs may include one or more than one LED.

With the device 710 of FIG. 7A, the control circuitry may include a ratio metric series resistor string configured to sense a first proportion and a second proportion of the rectified output, a first inverter configured to generate the first shunt signal based on the first proportion of the rectified output, and a second inverter configured to generate the second shunt signal based on the second proportion of the rectified output. With this embodiment, the first inverter may include a first transistor configured to receive the first proportion of the rectified output and a first resistor coupled to the transistor and configured to generate the first shunt signal based on the first proportion of the rectified output and the second inverter may include a second transistor configured to receive the second proportion of the rectified output and a second resistor coupled to the second transistor and configured to generate the second shunt signal based on the second proportion of the rectified output.

The first or second switch may be a field effect transistor having a gate configured to receive a respective first shunt signal with a drain and source connected in shunt across a respective group of LEDs. In another embodiment, the first or second switch may be a bipolar transistor having a base configured to receive a respective first shunt signal and an emitter and collector connected in shunt across a respective group of LEDs.

It is possible to include multiple additional tap points at various points in the LED string, and triggered at various AC input voltage points, allowing for additional incremental improvements in the peak to average LED power ratio, and in the PF. Inverters created by R4 and R5 and the FETs attached below them could be replaced by any type of inverter including, but not limited to, full CMOS inverters, PMOS inverters, NPN or PNP inverters.

Figure 7B:
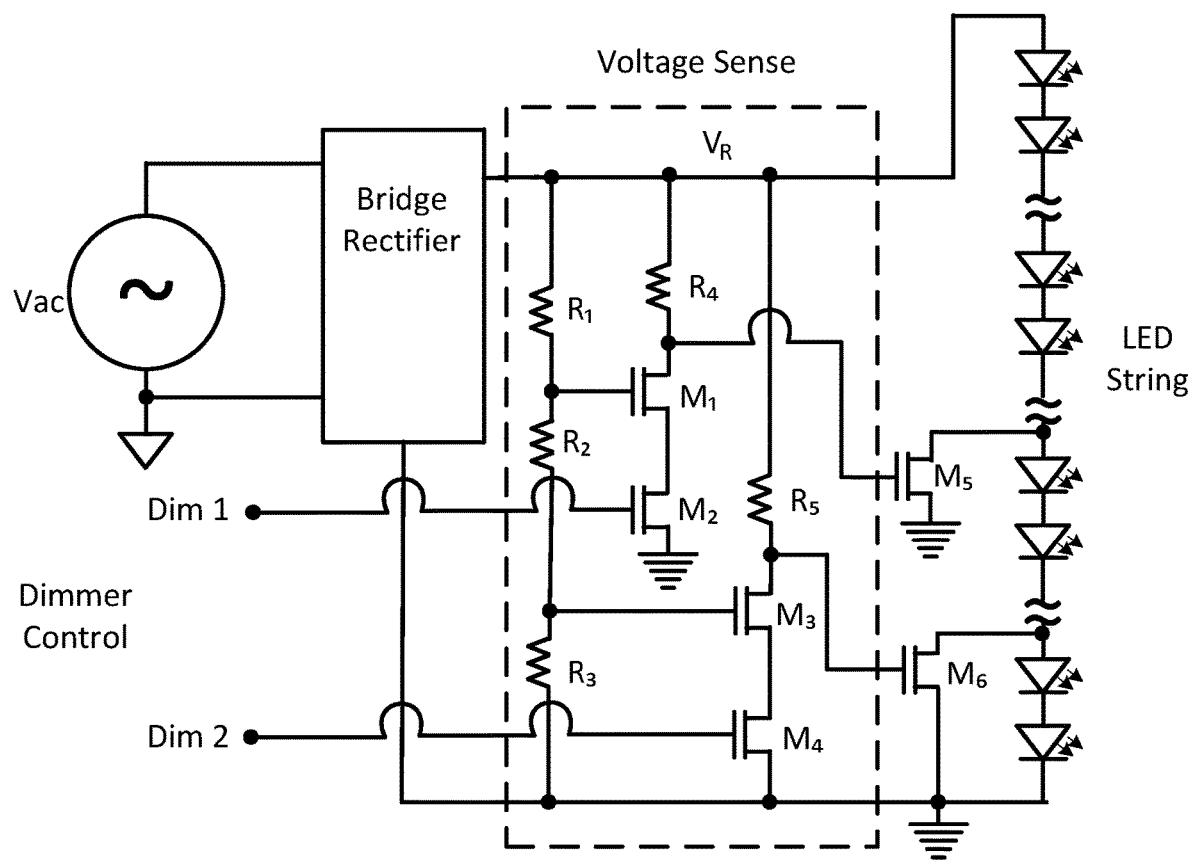
FIG. 7B illustrates an LED light constructed according to another embodiment of the present invention with dimmer control.

FIG. 7B illustrates an LED light constructed according to another embodiment of the present invention with dimmer control. A modification allows dimmer control of the further improved LED string. Gating Dim 1 and Dim 2 to a logic-high allows the further improved LED string to operate as the circuit in FIG. 7A. However, gating dimmer control signal Dim 2 to a logic-low while keeping Dim 1 at a logic-high prevents device M6 from ever turning off. This action switches fewer diodes across the rectified supply causes an increase in light output, thereby offering two levels of dimmer capability. Furthermore, by switching Dim 1 and Dim 2 to various logic levels as shown in Table 1 below, allows three dimmer levels to be achieved.

One drawback is that the PF of the LED light bulb will vary with Dim 1 and 2 settings as shown in the Table 1. In fact, the PF is worse when the LED string is consuming the most power.

This will be unacceptable in some applications.

TABLE 1

Brightness and PF for Dim states

| | Logic State | | | |
|---|---|---|---|---|
| Dim 1 | 0 | 0 | 1 | 1 |
| Dim 2 | 0 | 1 | 0 | 1 |
| Brightness | high | high | medium | low |
| Approximate PF | 0.7 | 0.7 | 0.8 | 0.9 |

Figure 7C:
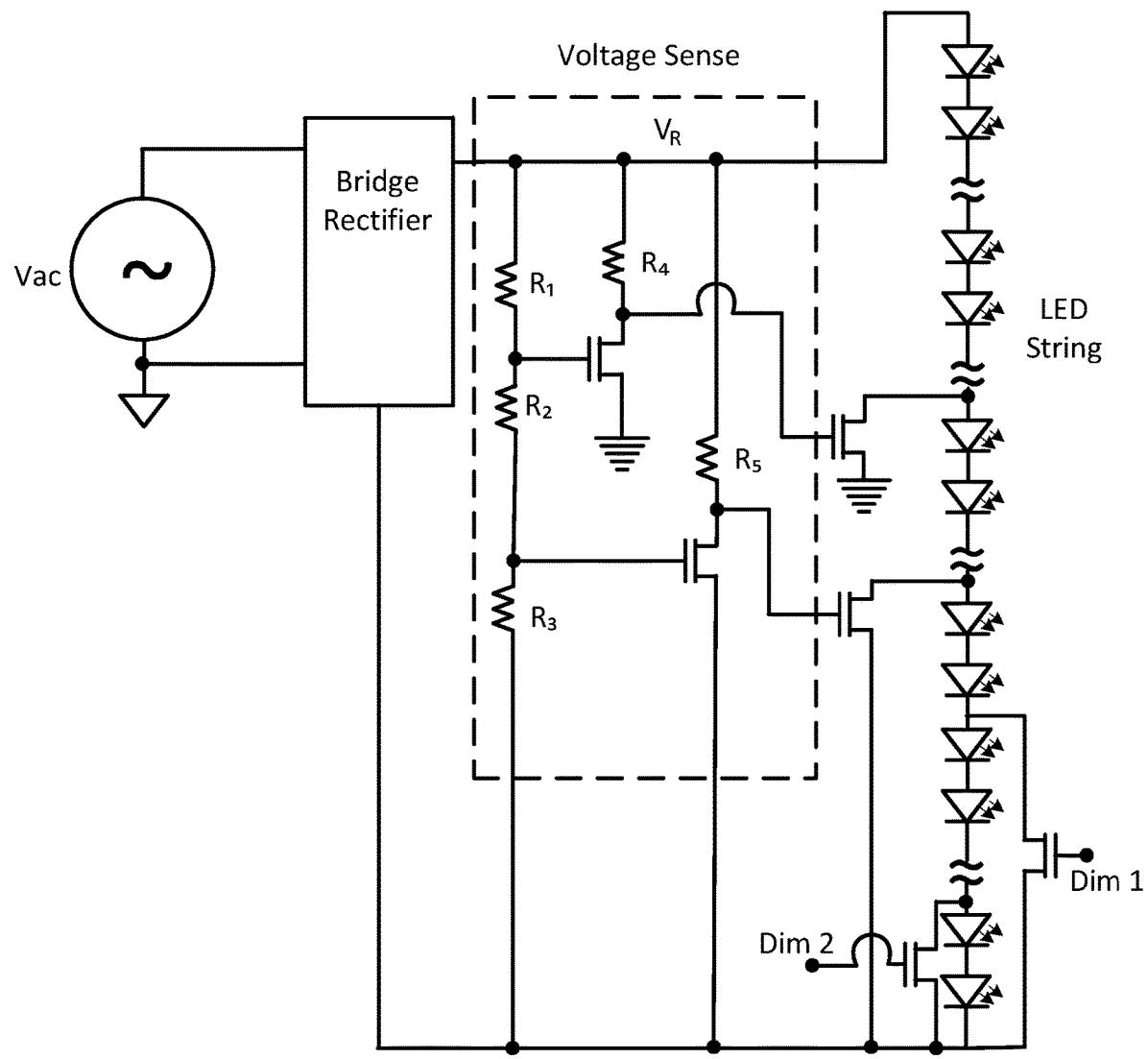
FIG. 7C illustrates an LED light constructed according to another embodiment of the present invention with voltage sensing circuitry and dimmer control.

FIG. 7C illustrates an LED light constructed according to another embodiment of the present invention with voltage sensing circuitry and dimmer control. Other switching schemes could be used to achieve a high PF at high brightness. When Dim 1 and Dim 2 are set to a logic-high, the circuit behaves exactly like the circuit in FIG. 7A with a high PF of about 0.9. However, when Dim 1 is set to a logic-low and Dim 2 is maintained at a logic-high, the LED string brightness is reduced along with the PF, but a reduced PF is not as big of an issue when the LED string in drawing less power from the supply. Likewise, when both Dim 1 and 2 are set to a logic-low, the PF again is reduced, but so are the brightness and the power drawn from the supply. See Table 2.

TABLE 2

Brightness and PF for each Dim state

| | Logic State | | | |
|---|---|---|---|---|
| Dim 1 | 0 | 0 | 1 | 1 |
| Dim 2 | 0 | 1 | 0 | 1 |
| Brightness | low | medium | high | high |
| Approximate PF | low | medium | high (0.9) | high (0.9) |

There are other possible switching schemes that will yield varying performance of brightness and PF. Circuits constructed according to the present invention use various switching schemes to achieve improved PF, dimmer capability or both in one switching circuit. Any electronic technology could be used to accomplish the switching discussed including, but not limited to, bipolar, MOSFET, GAS, MEMS, integrated circuit, or discrete component technologies.

Figure 7D:
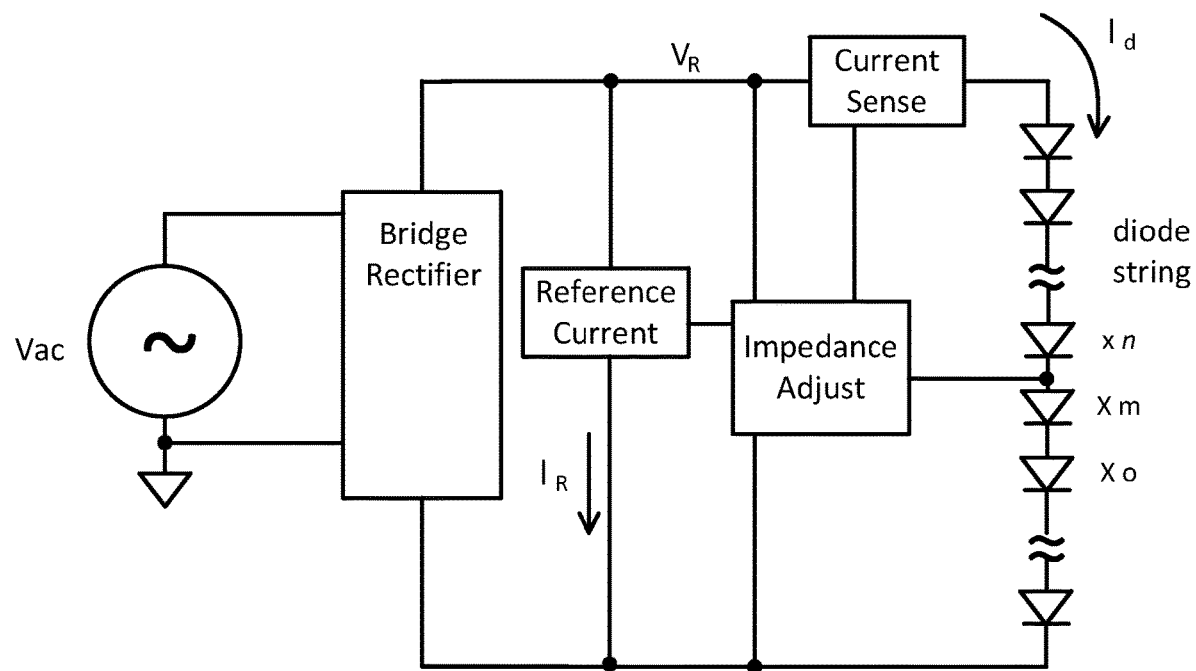
FIG. 7D illustrates an LED light constructed according to another embodiment of the present invention with current sensing circuitry.

FIG. 7D illustrates an LED light constructed according to another embodiment of the present invention with current sensing circuitry. To improve PF, the non-linear nature of the LED string can be improved using a current sensing circuit as shown in FIG. 7D. The current in the diode string (Id) is sensed by the current sense circuit. The current sense circuit may be a resistor. Id is then compared to a reference current (Ir) generated by the reference current circuit. The reference current circuit may be comprised of two resistors. The current difference is used to adjust the impedance of the diode string such that it appears more linear or resistive and less non-linear like a diode. The impedance adjust circuit may be implemented with a switch.

A low voltage (Vr) on the LED string, will produce an Id=0 amps, because the LED's have insufficient voltage to forward bias them. Ir, however, will not be zero which, when compared to Id will activate the impedance adjust circuit to shunt one tap of the diode string to bottom of the LED string. Id initially will be zero, but eventually, at some Vr level, Id will exceed Ir and cause the impedance adjust circuit to free the tap that was shunted to the bottom of the LED string. This "freeing the tap" can happen continuously or all at once with a switch. This freeing of the tap will increase the impedance of the LED string removing some of its non-linearity.

Figure 7E:
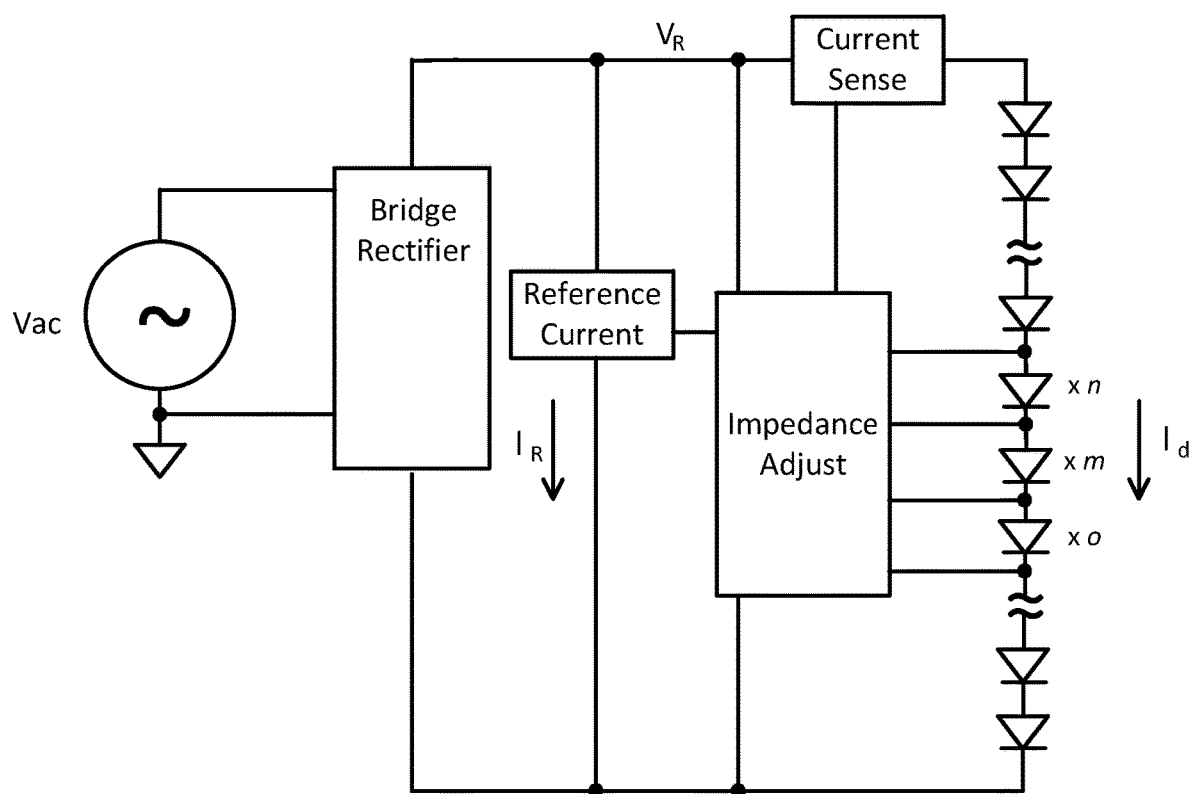
FIG. 7E illustrates an LED light constructed according to another embodiment of the present invention with current sensing circuitry and multiple tap impedance adjust circuitry.

FIG. 7E illustrates an LED light constructed according to another embodiment of the present invention with current sensing circuitry and multiple tap impedance adjust circuitry. With FIG. 7E, an LED linearization scheme uses current sensing and multiple taps. It operates much like the scheme in FIG. 7D, but uses multiple taps to adjust the impedance of the LED string. The multiple taps are better suited for a digital or switched implementation rather than a continuous or analog implementation. As Ir increases and Id varies based on switch position of the taps, the impedance adjust circuit tries to maintain Id=Ir, creating a more linearized LED string.

Figure 7F:
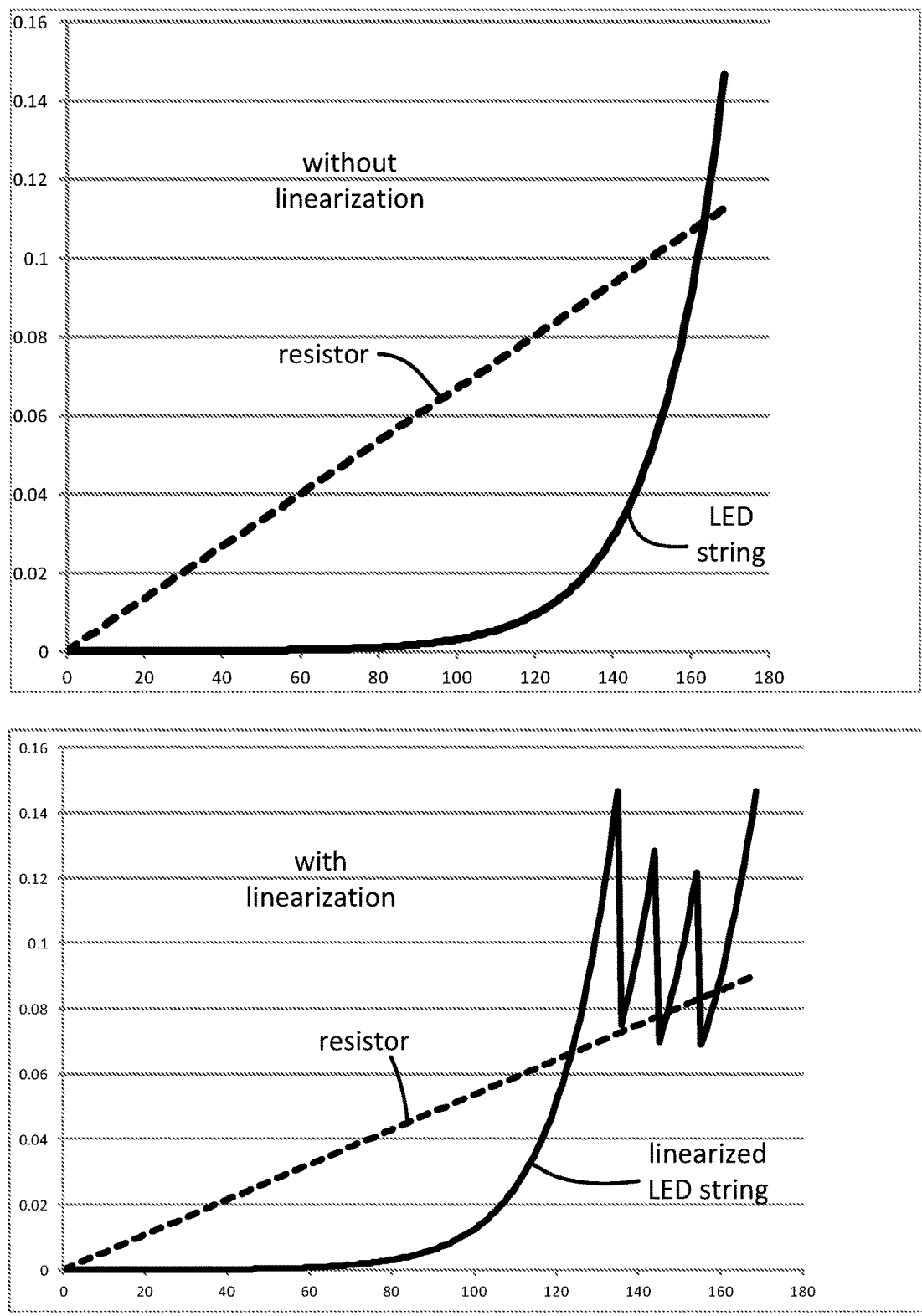
FIG. 7F illustrates behavior of an LED light constructed according to the present invention as compared to an LED light without linearization.

FIG. 7F illustrates behavior of an LED light constructed according to the present invention as compared to an LED light without linearization. FIG. 7F compares the I-V curves of a diode string and a resistor (top) and a linearized diode string and a resistor (bottom). Initially, when the voltage Vr is zero, all of the impedance adjust circuit switches are shorting LED string taps to the bottom of the LED string. As Vr increases, the difference between Ir and Id causes the impedance adjust circuit to releases the taps of the LED string from the bottom of the LED string in a sequential manner starting from the top tap. This causes the current in the LED string to decrease at each step of this process. That is the cause of the discontinuities in the LED string I-V curve in FIG. 7F.

Figure 7G:
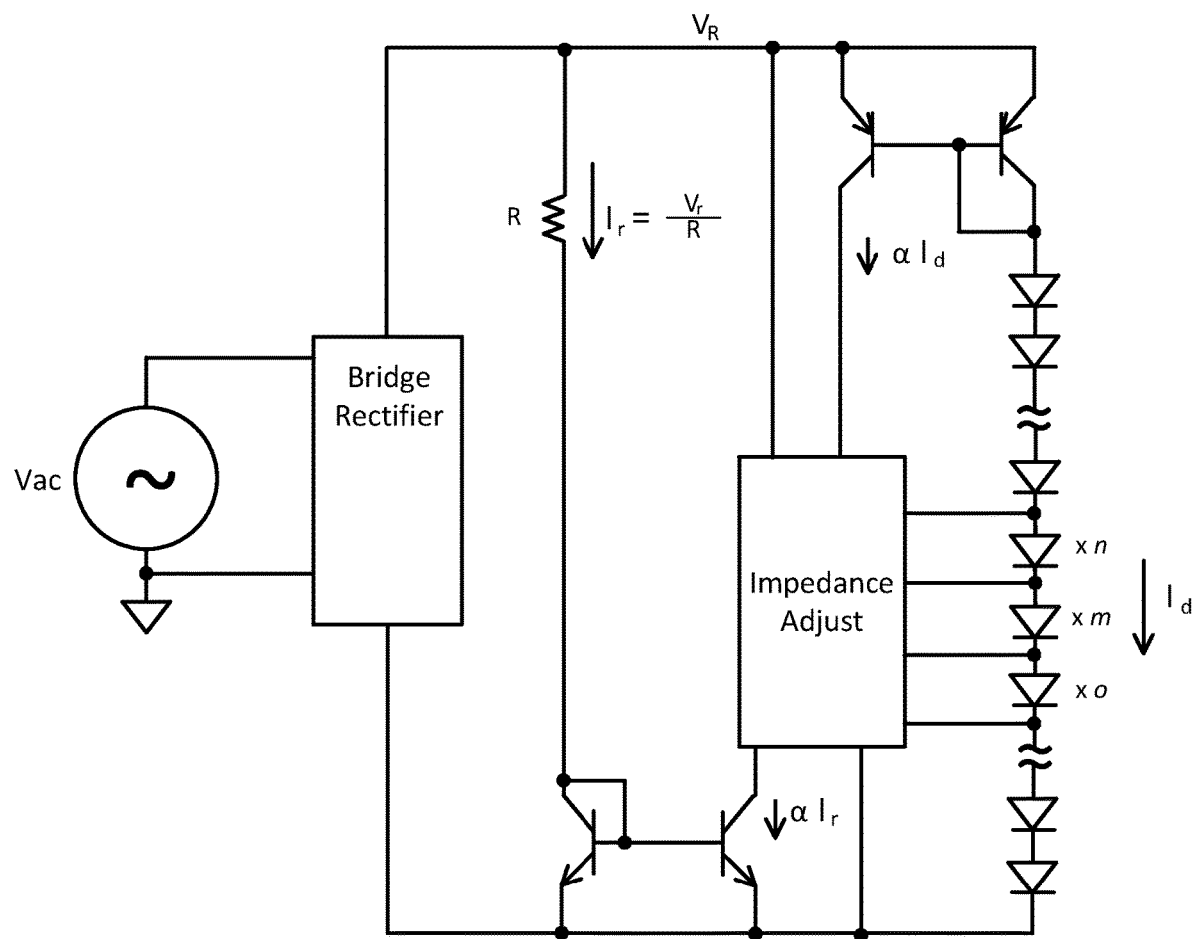
FIG. 7G illustrates an LED light constructed according to another embodiment of the present invention with current sensing circuitry and multiple tap impedance adjust circuitry using bipolar transistors.

FIG. 7G illustrates an LED light constructed according to another embodiment of the present invention with current sensing circuitry and multiple tap impedance adjust circuitry using bipolar transistors. The expanded view of the LED linearization circuit uses multiple taps and current sense. An approximate current Ir is setup in resistor R that flow through the NPN current mirror into the impedance adjust circuit. The current mirror has a mirror ratio of 1:n where n can have any value including 1. Another current mirror is used to send a proportion of the LED string current to the impedance adjust circuit. This current mirror has a mirror ratio of 1:n where n can have any value including 1. The impedance adjust circuit compares the mirrored currents and sequentially adjusts the taps that are switched to the bottom of the LED string.

Figure 8:
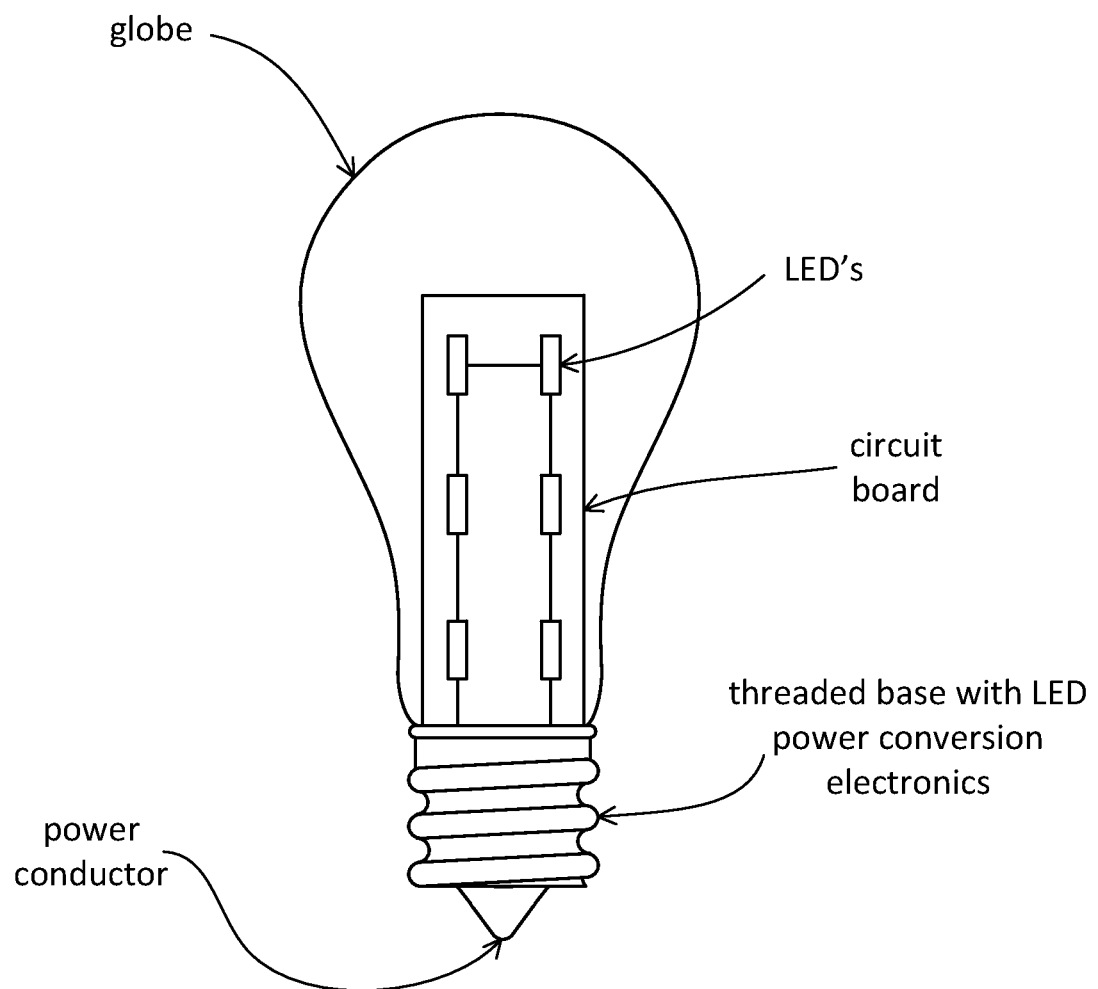
FIG. 8 illustrates an LED light constructed according to another embodiment of the present invention embodied in a conventional light bulb form.

FIG. 8 illustrates an LED light constructed according to another embodiment of the present invention embodied in a conventional light bulb form. With FIG. 8, an LED light bulb includes electronics. The bulb operates within a standard 120V or 240V AC light fixture. LED electronics in the base of the bulb includes a power conversion circuit to convert the AC supply power to a form suitable for the LEDs. The LEDs used normally require a phosphor, which can either be coated on a globe surrounding the LEDs and circuit boards, or alternately, the LEDs themselves can include the phosphor.

It is possible to move the LED electronics located in the LED light bulb to a light switch, which allows multiple LED light bulbs to share the LED electronics. The LED electronics in an LED light bulb account for a significant proportion of its complexity and cost of manufacturing said LED light bulb, so moving this functionality to the light switch and possibly sharing it between several LED light bulbs could reduce costs.

Figure 9:
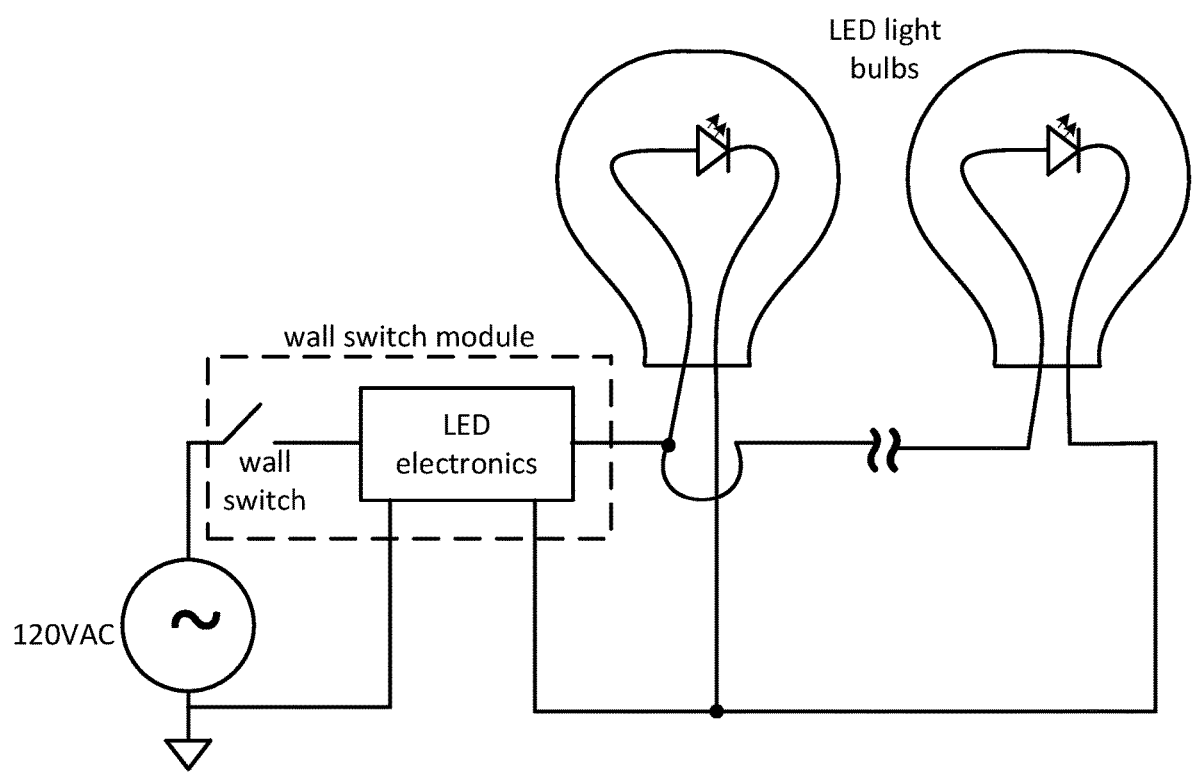
FIG. 9 illustrates an LED light constructed according to an embodiment of the present invention having electronics located in module remote to multiple LED bulbs.

FIG. 9 illustrates an LED light constructed according to an embodiment of the present invention having electronics located in module remote to multiple LED bulbs. In the embodiment of FIG. 9, the LED electronics in the light switch would remain powered down until the switch is turned on. When the switch is turned on, the LED electronics in the light switch power up and then begins to provide power to the LED light bulbs.

Figure 10:
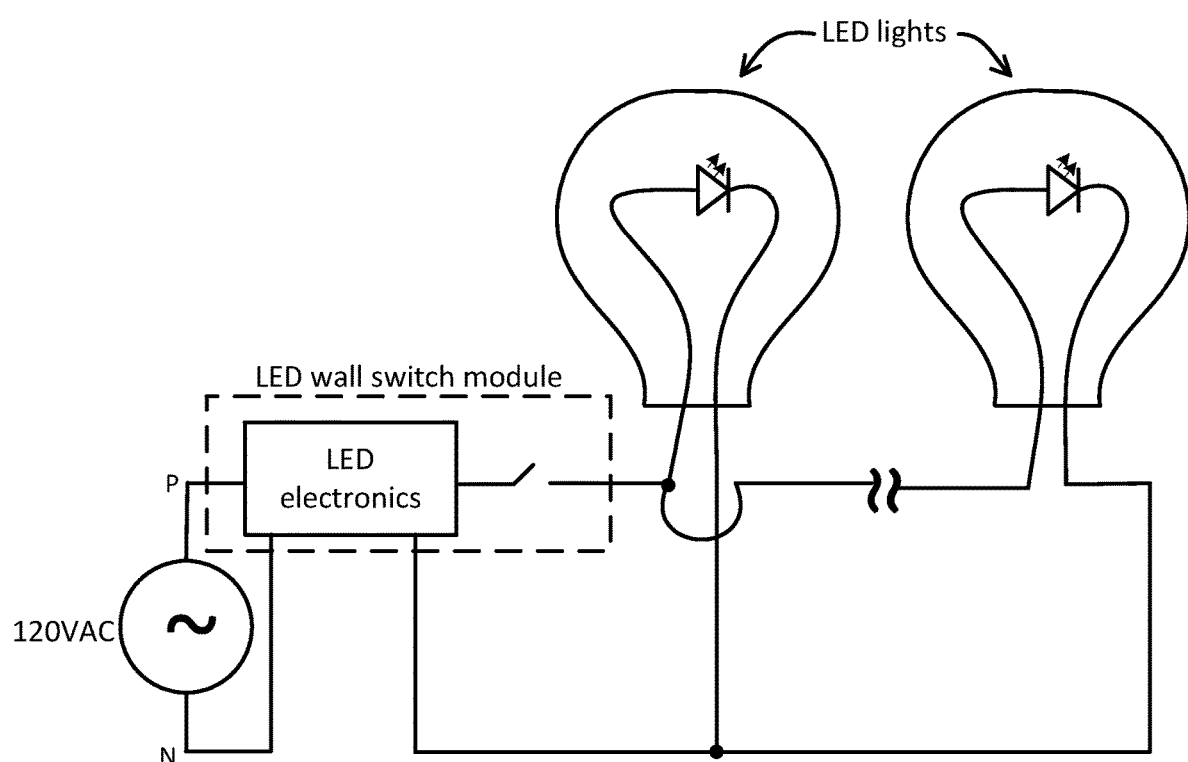
FIG. 10 illustrates an LED light constructed according to another embodiment of the present invention having electronics located in module remote to multiple LED bulbs.

FIG. 10 illustrates an LED light constructed according to another embodiment of the present invention having electronics located in module remote to multiple LED bulbs. In FIG. 10, the LED electronics could be connected to the AC mains supply all the time, and connected to the LED light bulbs via a switch. This would allow for a near zero startup time as the output stage of the power conversion circuit would already be ramped up to the necessary supply voltage at the time that the switch was closed.

Figure 11:
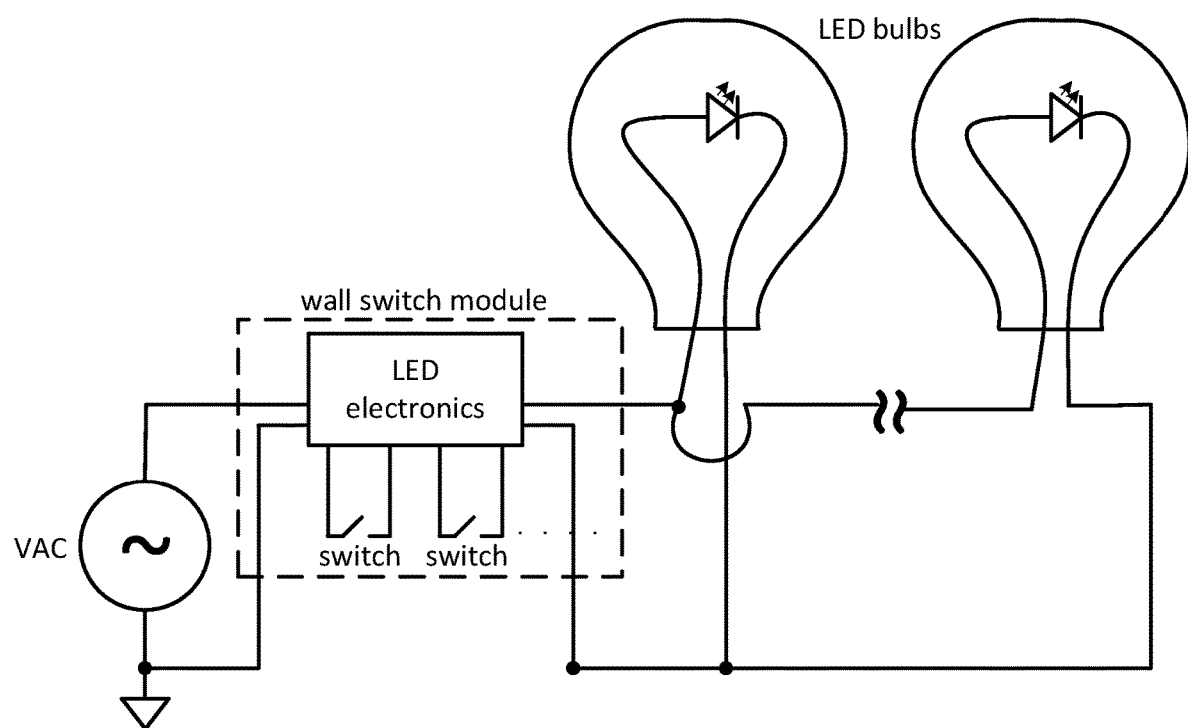
FIG. 11 illustrates an LED light constructed according to still another embodiment of the present invention having electronics located in module remote to multiple LED bulbs.

FIG. 11 illustrates an LED light constructed according to still another embodiment of the present invention having electronics located in module remote to multiple LED bulbs. In the embodiment shown in FIG. 11, the power conversion circuit is permanently connected to both the AC mains supply and the LED light bulbs. The operation of the power conversion circuit would then be controlled by a different means, such as a button, switch, touch sensor, remote control, or other mechanism.

Figure 12:
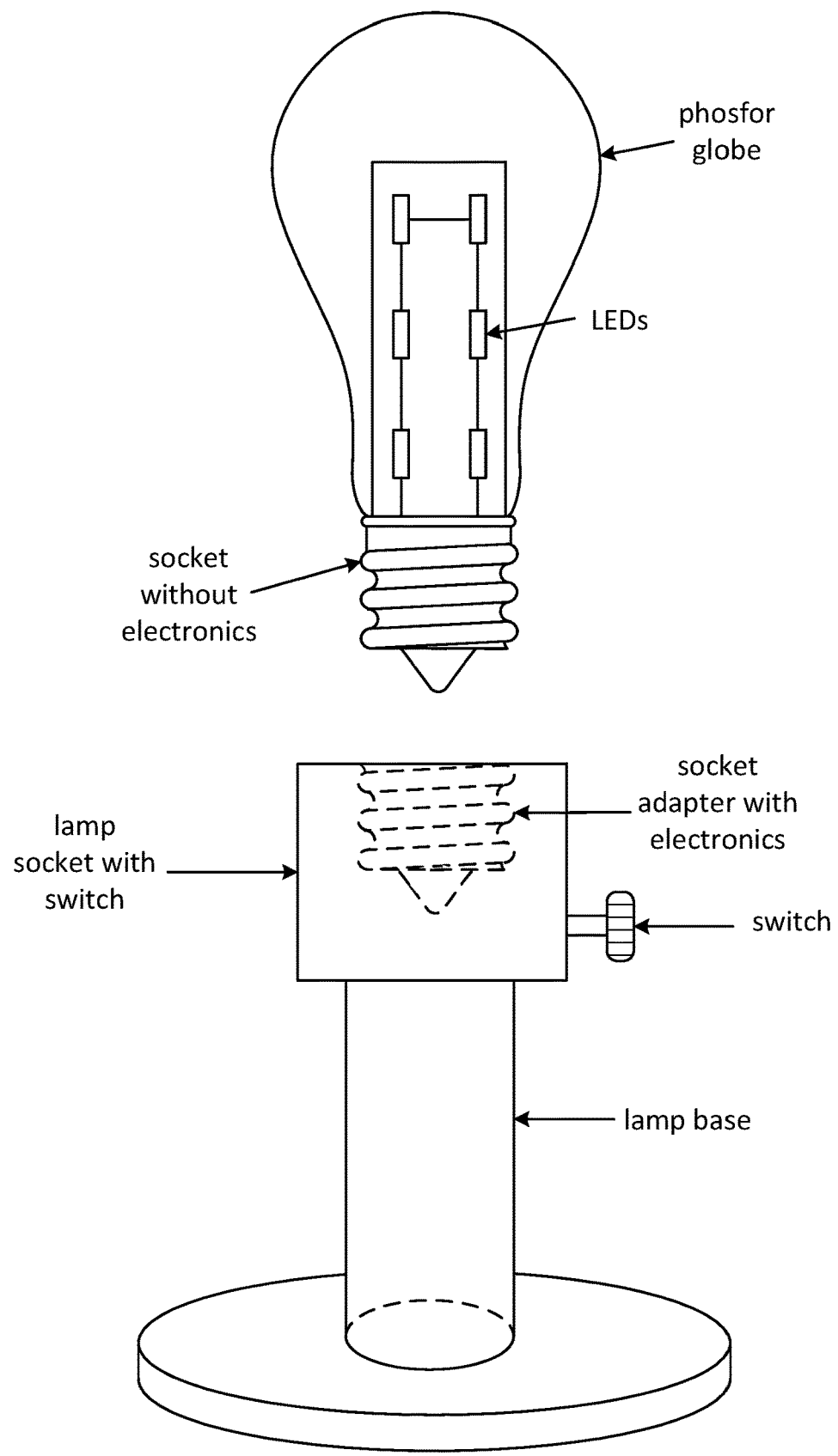
FIG. 12 illustrates an LED light constructed according to another embodiment of the present invention embodied in a conventional light bulb form with electronics located in a base.

FIG. 12 illustrates an LED light constructed according to another embodiment of the present invention embodied in a conventional light bulb form with electronics located in a base. It is possible to use one of these LED light bulbs that did not include LED electronics in a standard light socket through the use of an adapter as shown in FIG. 12. The adapter would contain the LED electronics needed to supply the LEDs, by converting power from the AC mains supply provided by the standard light bulb socket.

No matter if the LED electronics are located in the light switch or in the base of the LED light bulb, this LED electronics may need some time to power up fully and begin supplying power to the LEDs in the LED light bulb. For some LED light bulbs in the market today, this "turn-on" delay can be long enough to be noticeable by the consumer. A long "turn-on" delay is not desirable, so it would be beneficial to reduce or eliminate it.

Figure 13A:
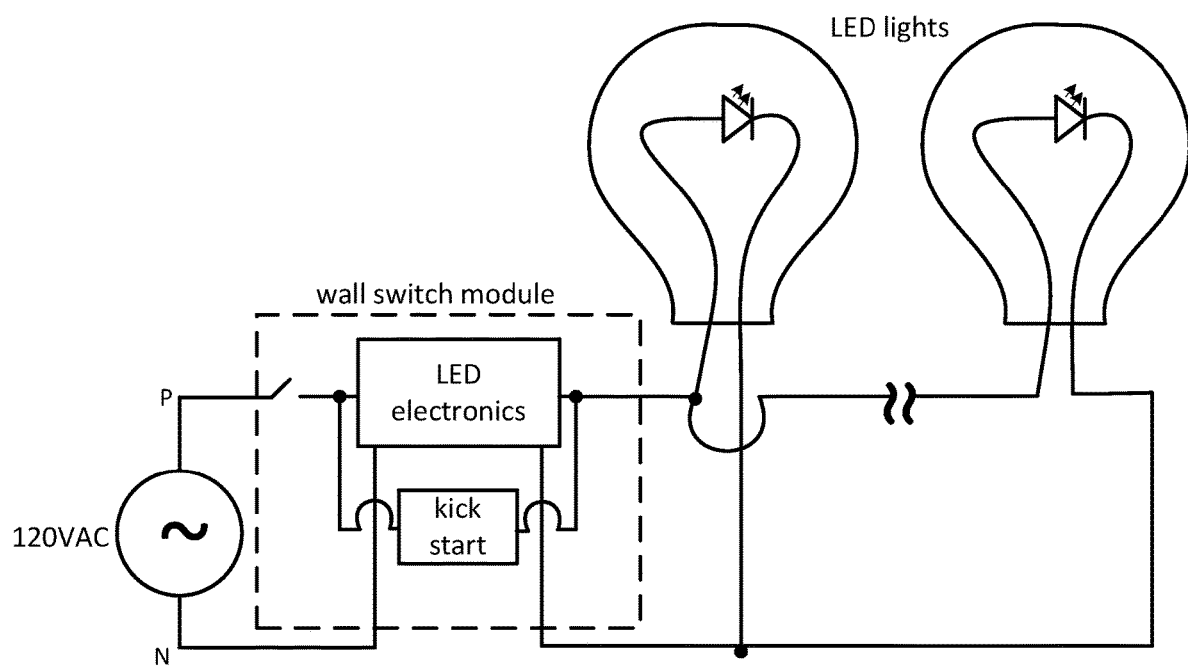
FIG. 13A illustrates an LED light constructed according to an embodiment of the present invention having electronics located in module remote to multiple LED bulbs and having kick start circuitry.

FIG. 13A illustrates an LED light constructed according to an embodiment of the present invention having electronics located in module remote to multiple LED bulbs and having kick start circuitry. It is possible to shorten the "turn-on" delay through the use of a "kick start" circuit as shown in FIG. 13A, which bypasses the normal power conversion electronics and which operates for only a short period of time immediately after the LED light bulb is turned on.

Figure 13B:
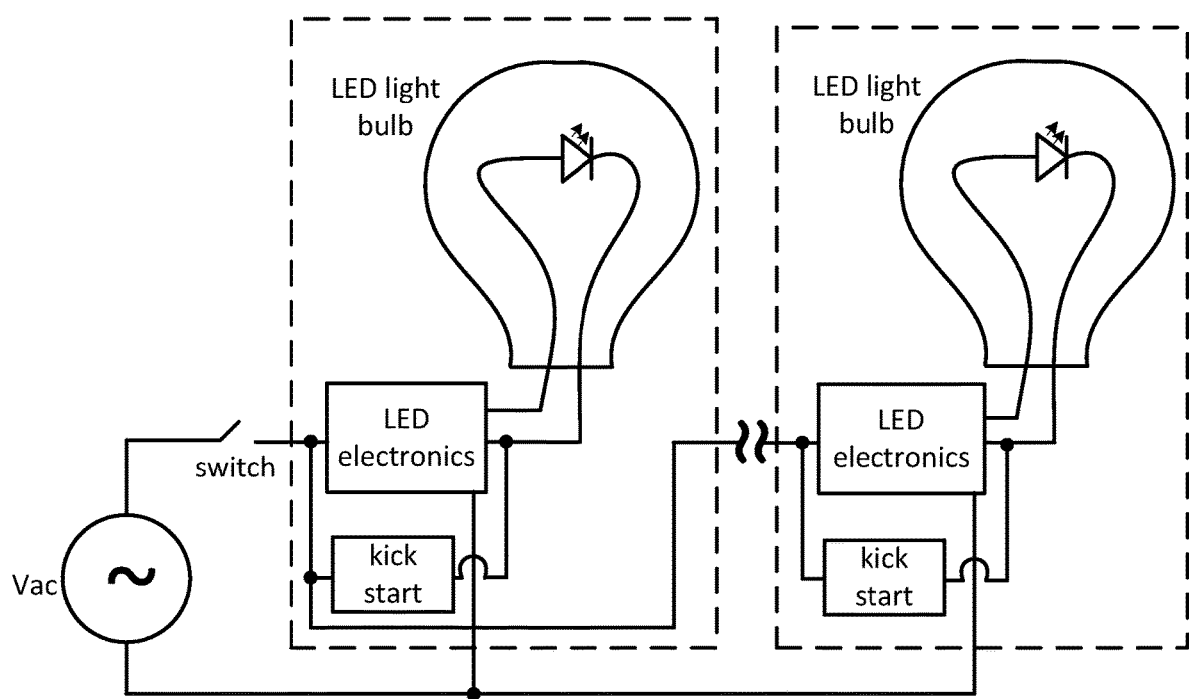
FIG. 13B illustrates an LED light constructed according to an embodiment of the present invention having electronics located in module remote to multiple LED bulbs and having kick start circuitry respective to each LED bulb.

FIG. 13B illustrates an LED light constructed according to an embodiment of the present invention having electronics located in module remote to multiple LED bulbs and having kick start circuitry respective to each LED bulb. An alternative embodiment of the kick start circuit application is shown in FIG. 13B. In this embodiment of the present invention, the kick start circuit is embedded in each individual light bulb. In this way, an ordinary wall light switch can be used.

The efficiency of the power conversion performed by the LED electronics is an important metric, since this will partially determine the efficiency of the LED light bulb, but because the kick start circuit only operates for a short period of time when the LED light bulb is turned on, its efficiency is much less important.

Figure 14:
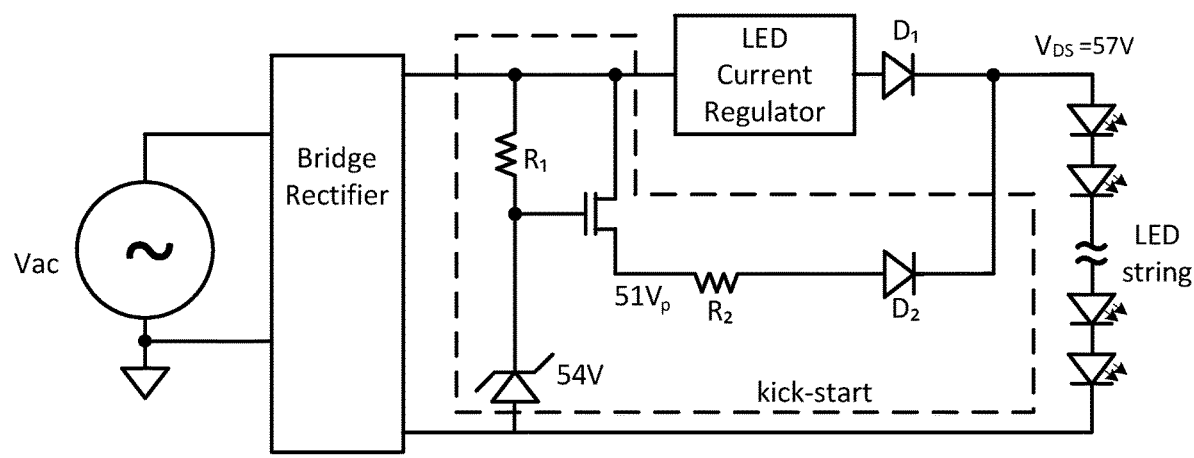
FIG. 14 illustrates an LED light constructed according to an embodiment of the present invention having kick start circuitry shown in detail.

FIG. 14 illustrates an LED light constructed according to an embodiment of the present invention having kick start circuitry shown in detail. Initially, when power is applied to the LED current regulator, high-valued resistor R1 impresses 54V on the zener diode. The n-channel transistor, connected in a source follower configuration, drives low-valued resistor R2 and diode D2 to about 51V. This forward biases D2 and immediately powers the LED string with about 50V creating instantaneous light. Some delay later, when the LED current regulator circuit powers up, D1 forward biases, establishing about 57V on the LED string. With 57V impressed on the LED string, D2 becomes reversed biased and current no longer flows through D2. This disables the kick start circuit allowing the LED current regulator to power the LED string.

Figure 15:
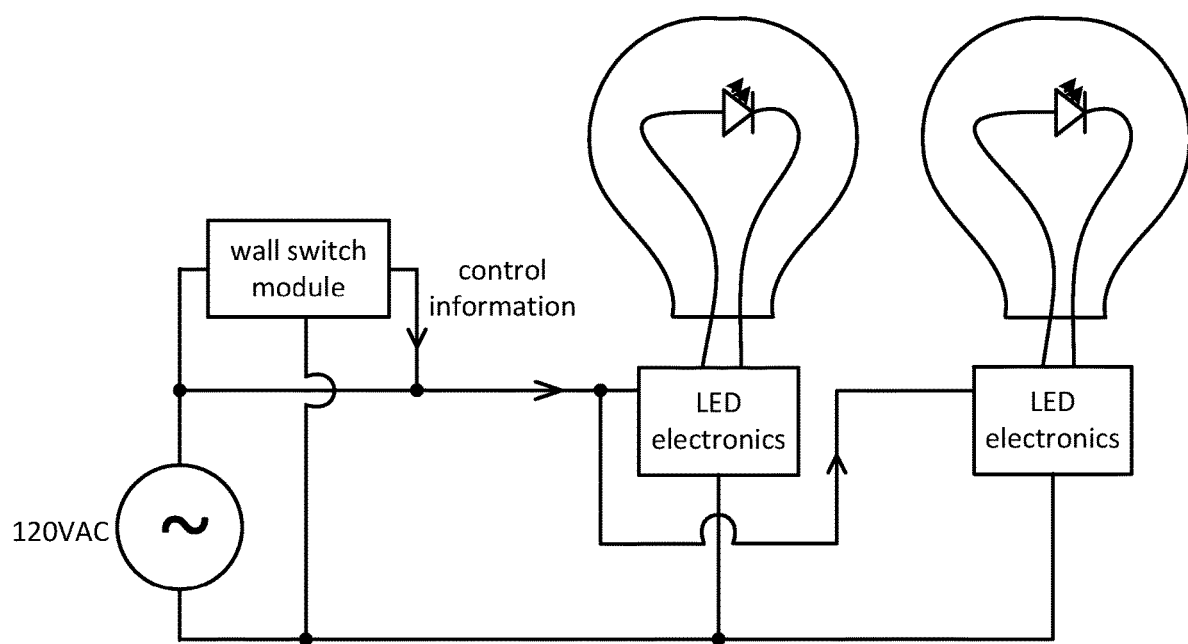
FIG. 15 illustrates an LED light constructed according to an embodiment of the present invention having LED electronics respective to multiple LED bulbs and a wall mounted switch configured to relay control information to the LED electronics.

FIG. 15 illustrates an LED light constructed according to an embodiment of the present invention having LED electronics respective to multiple LED bulbs and a wall mounted switch configured to relay control information to the LED electronics. LED light bulbs normally include LED electronics to convert power from the AC mains supply to a form suitable for use by the LEDs. It is usually possible to also include some inexpensive control circuitry that implements features that can increase the usefulness of the LED light bulbs, as shown in FIG. 15.

One such feature could be to transmit control information from the light switch to the LED light bulb over the power wire. The control information could instruct the LED light to turn on or off, or could control dimming of the LED light's output, thereby allowing for the configuration of lights and switches in a house to be changed without having to rewire the house. The control information could also be used to control the operation of other devices, such as ceiling fans, air conditioning, and heater units, thereby allowing an intelligent switch to control multiple devices in a house.

There are a number of means for sending such control information over the power wires. One means would be to send a signal modulated at a frequency well above the 50 or 60 Hz normally used by AC mains power. Other data transmission means could be used such as PPM, PDM, PWM, FM, AM QPSK, OFDM, etc. . . .

Figure 16:
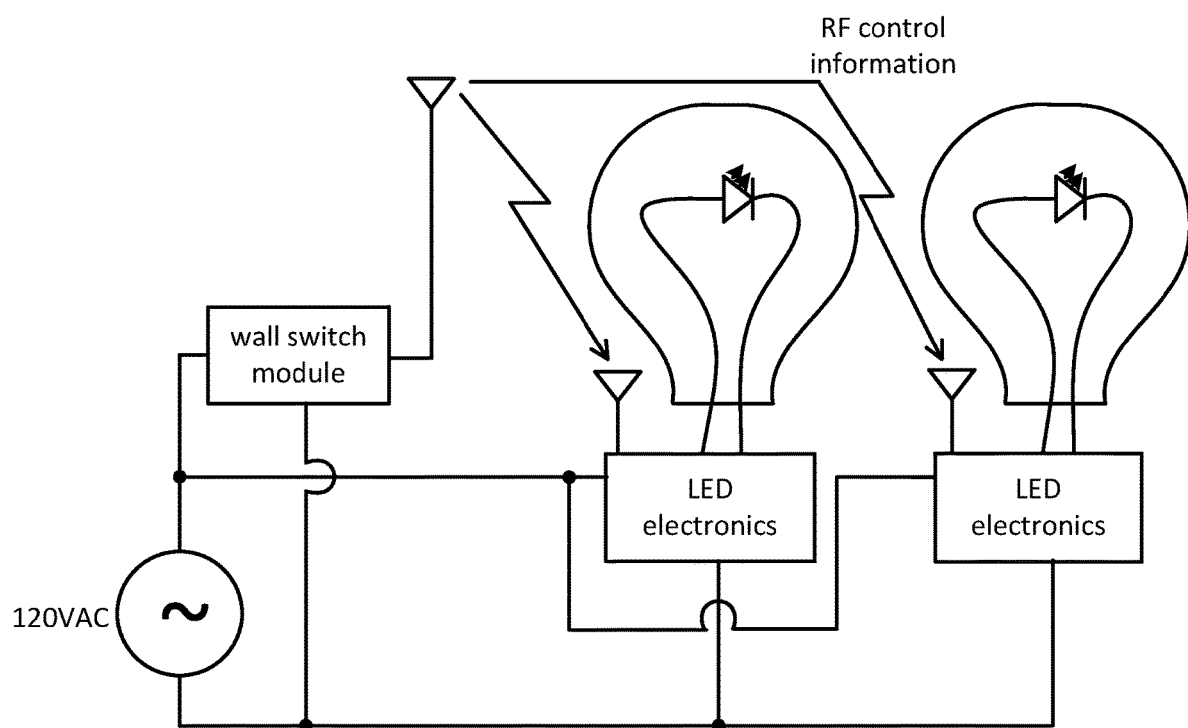
FIG. 16 illustrates an LED light constructed according to an embodiment of the present invention having LED electronics respective to multiple LED bulbs and a wall mounted switch configured to wirelessly relay control information to the LED electronics.
Figure 16A:
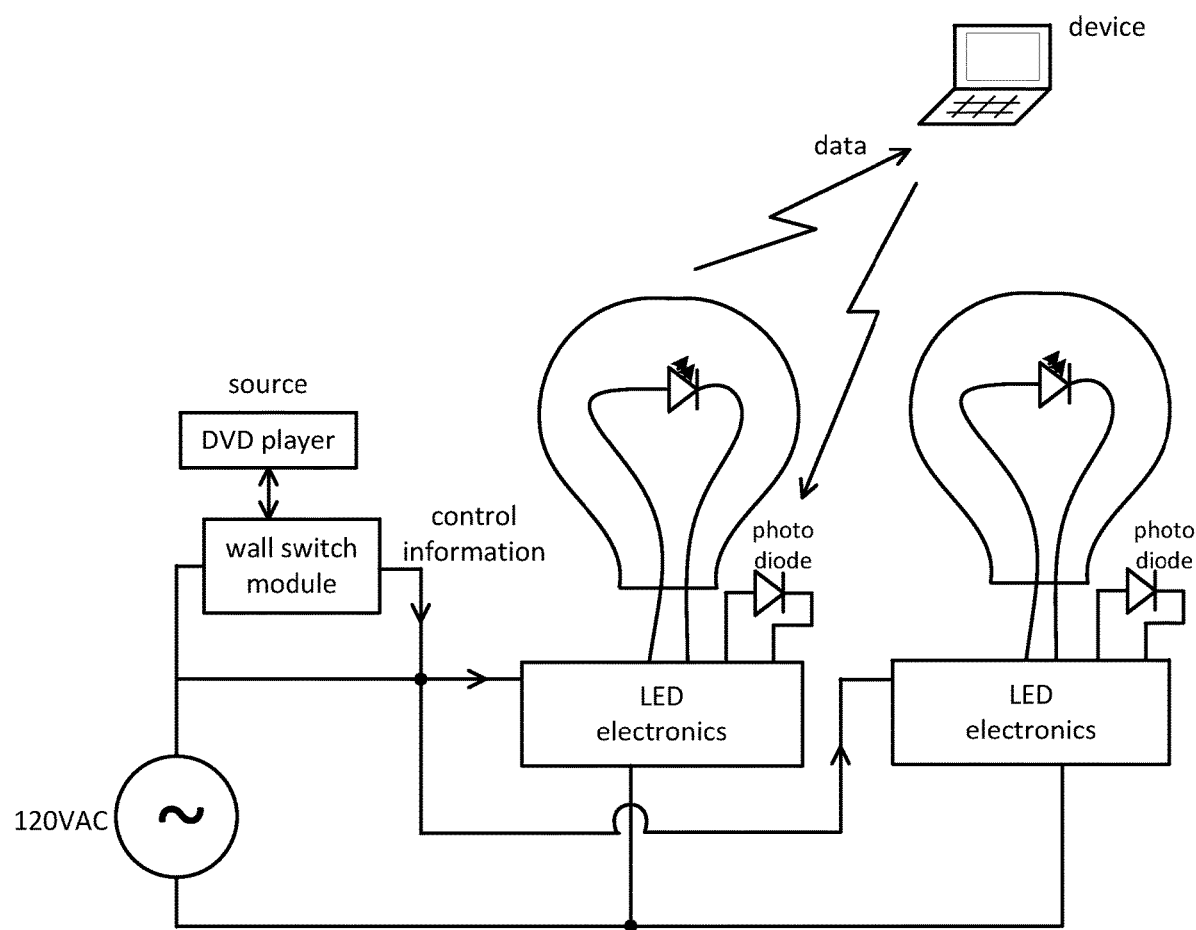
FIG. 16A illustrates an LED light constructed according to an embodiment of the present invention having LED electronics respective to multiple LED bulbs and a wall mounted switch configured to relay control information to the LED electronics and to service wireless communications with a client device.

FIG. 16 illustrates an LED light constructed according to an embodiment of the present invention having LED electronics respective to multiple LED bulbs and a wall mounted switch configured to wirelessly relay control information to the LED electronics. The signal could be transmitted from the light switch to the LED lights by other means, such as radio frequency, or infrared light as shown in FIGS. 16 and 16A. This signal could also contain data such as video, pictures, music, or Internet data.

FIG. 16A illustrates an LED light constructed according to an embodiment of the present invention having LED electronics respective to multiple LED bulbs and a wall mounted switch configured to relay control information to the LED electronics and to service wireless communications with a client device. Light from LEDs is commonly used to transmit data at very high data rates, such as in fiber optic communication, as well as at medium to low data rates, such as in infrared remote controls. An intelligent LED light bulb could be used to transmit information to other devices such as laptops using LED light as shown in FIG. 16A. It would also be possible for data to be transmitted by a remote device and received by the LED light bulb.

In FIG. 16A, a video source digital output is sent to the wall switch module and converted to a power line data stream. This power line data stream is sent to the LED light bulbs where their LED electronics modulates this data stream into high frequency light pulses of low and high intensity. A device, such as a laptop or smart phone, receives this data through a built-in or peripheral light receiving communication device. This light receiving communication device may be a camera that is mounted on the face of the laptop or smart phone or it may be an aftermarket USB plug in light communication device.

It may be necessary for reverse communication from the laptop or smart phone to the light bulb. In this case, the light bulb would need to contain light receiving devices such as photodiodes. The reverse communication path may be used to send data back to the wall switch, for error checking and correcting or to maintain the communication link. The data stream sent over the power line may also require a reverse communication channel. Modulation for the light communication may include but is not limited to PWM, PPM, PDM, or communication that complies with IEEE 802.15.7. Since the modulation frequency of the light signal is much higher than the persistence of the human eye, the flicker produced is imperceptible.

This type of light communication does not have to be limited to LED light bulb to laptop or smart phone. It could also be LED light bulb to LED light bulb. This would allow the light bulbs to act as repeaters or to synchronize or cooperate with each other such as in a mesh network.

Figure 16B:
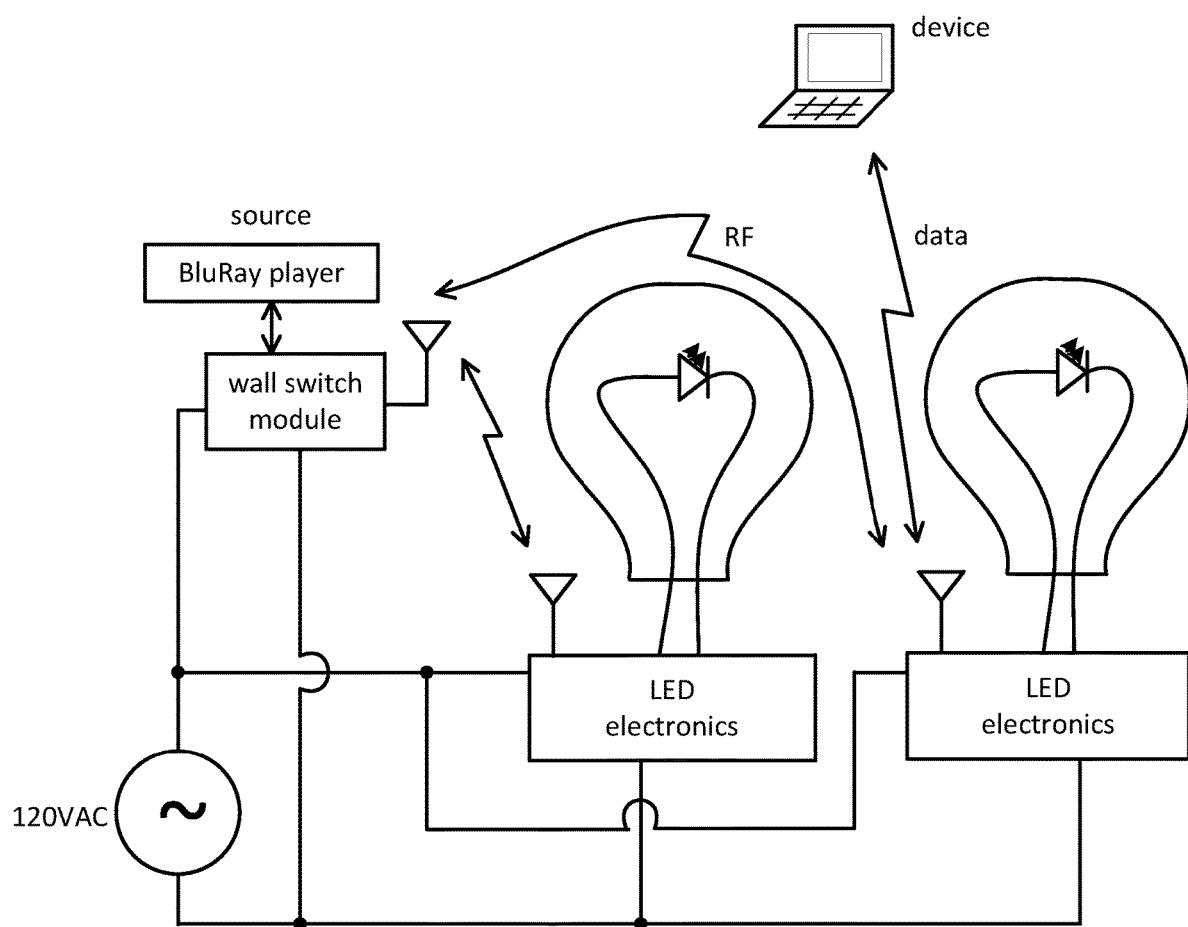
FIG. 16B illustrates an LED light constructed according to an embodiment of the present invention having LED electronics respective to multiple LED bulbs and a wall mounted switch configured to wirelessly relay control information to the LED electronics and to service wireless communications with a client device.

FIG. 16B illustrates an LED light constructed according to an embodiment of the present invention having LED electronics respective to multiple LED bulbs and a wall mounted switch configured to wirelessly relay control information to the LED electronics and to service wireless communications with a client device. The communication between the laptop or smart phone does not need to be light communication, it may also be radio frequency communication, as shown in FIG. 16B. Some examples of wireless communications that could be used are 802.11a/b/g/n, WiMAX, 3G, 4G, or Bluetooth. This type of communication could leverage the wireless communications that are already built in to laptops and smart phones. With wireless communication, the wall switch module could send the source data to the LED light bulbs through radio frequency as shown in FIGS. 16B and 16C instead of over the power lines as depicted in FIG. 16A.

Figure 16C:
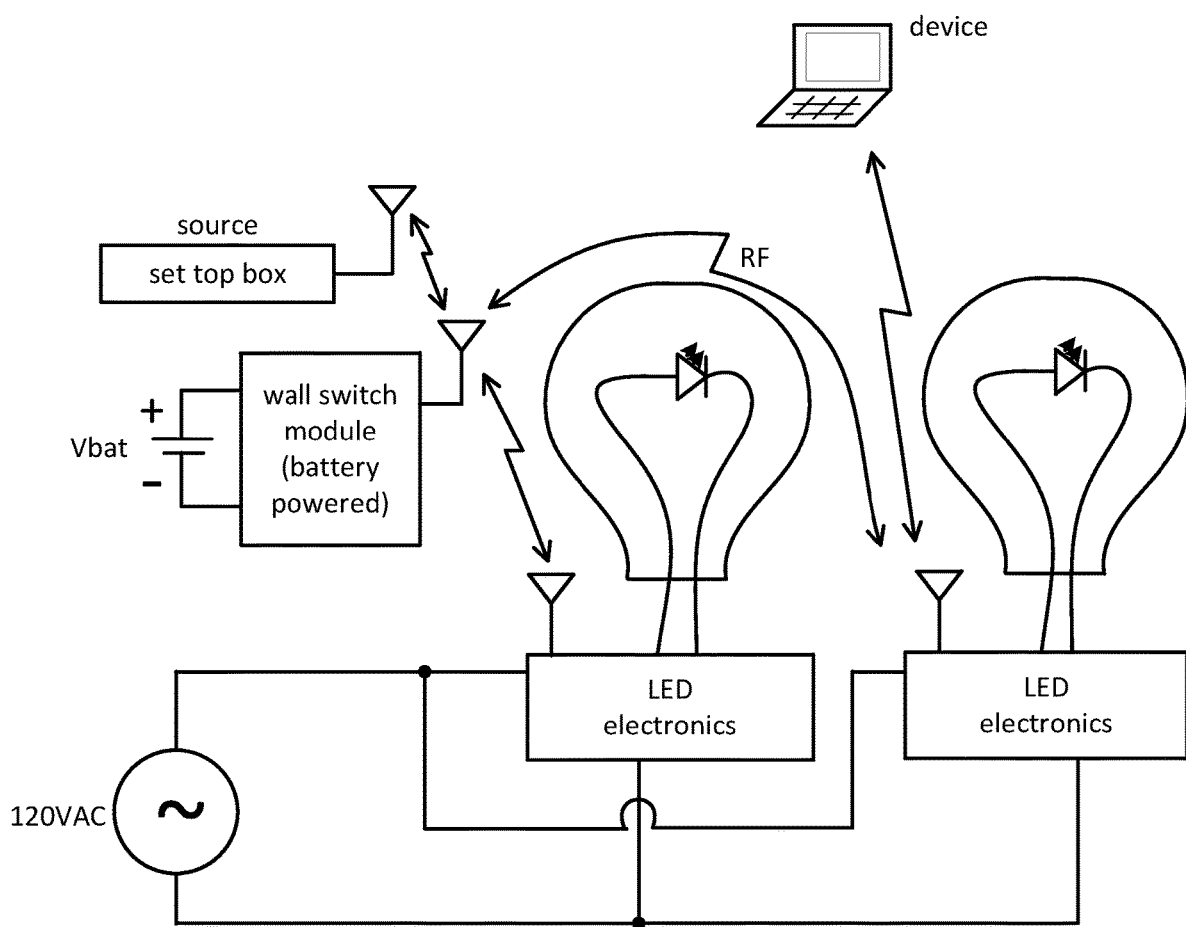
FIG. 16C illustrates LED light constructed according to another embodiment of the present invention having LED electronics respective to multiple LED bulbs and a wall mounted switch configured to wirelessly relay control information to the LED electronics and to service wireless communications with a client device.

FIG. 16C illustrates LED light constructed according to another embodiment of the present invention having LED electronics respective to multiple LED bulbs and a wall mounted switch configured to wirelessly relay control information to the LED electronics and to service wireless communications with a client device. FIG. 16C depicts a similar system to that in FIG. 16B, but with the wall switch module powered from a battery rather than the 120 VAC mains. In this way, the wall switch module can be mobile and embedded into a hand-held home automation controller or smart phone.

The communication of signals does not need to be only from a light switch to LED light bulbs, the signal could also go in the opposite direction from the LED light bulb to the switch, or from one LED light bulb to another LED light bulb.

One use of multi direction transmission of such a signal would be to implement energy saving features. Some or all LED light bulbs could be equipped with a motion sensor, or a sound sensor, or a similar sensor that would allow the LED light bulbs to sense when an occupant is present, and then turn off or dim the light if no occupancy is detected for a suitable period of time. Multiple LED light bulbs could cooperate so that a single LED light bulb detecting an occupant would be sufficient to keep several LED light bulbs operating at full brightness in the vicinity of the occupant.

Figure 16D:
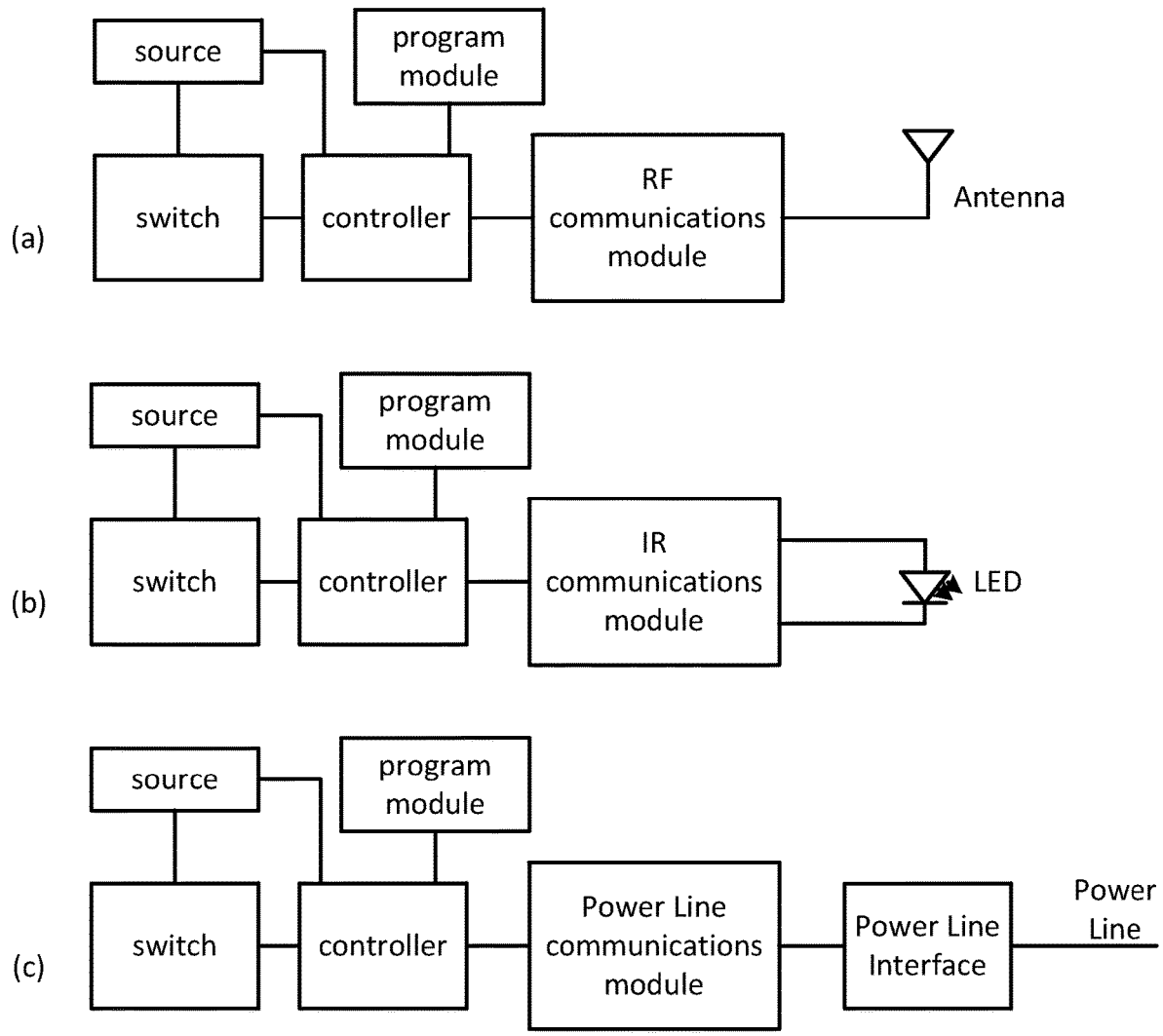
FIG. 16D illustrates three differing embodiments of an LED light controller constructed according the present invention that supports communications with remote devices.

FIG. 16D illustrates three differing embodiments of an LED light controller constructed according the present invention that supports communications with remote devices. Three communication modules have been discussed; power line, light and radio frequency (RF). Block diagrams of each of these systems is shown in FIG. 16D. The RF communication system (a) contains a controller that accepts information in the form of data from a switch and a source. The data from the switch might contain on/off control information or strobe or dimmer information. The data from the source might contain cable or satellite set top box video and audio information or a digital data stream from a DVD or CD player or it might even contain information from a PC or internet streaming device such as an Apple TV or Roku entertainment device.

The controller formats the data and provides Media Access Control (MAC) and physical layer (PHY) processing. These MAC and PHY functions might include scrambling, coding, interleaving, mapping, FFT and IFFT, adding cyclic prefix, framing and error correction. The program module stores the software and firmware code required by the controller. Memory is a key element of the program module.

After the data is formatted by the controller, it is passed to the RF communication module where is it converted to an analog signal, mixed or modulated up to an RF frequency and transmitted by an RF power amplifier to an antenna. The antenna projects the RF signal through the air in a pattern pre-determined by the physical shape and electrical properties of the antenna. The light communication system (b) contains a controller that accepts information in the form of data from a switch and a source. The data from the switch might contain on/off control information or strobe or dimmer information. The data from the source might contain cable or satellite set top box video and audio information or a digital data stream from a DVD or CD player or it might even contain information from a PC or internet streaming device such as an Apple TV or Roku entertainment device.

The controller formats the data and provides Media Access Control (MAC) and physical layer (PHY) processing. These MAC and PHY functions may include scrambling, coding, interleaving, framing and error correction. The program module stores the software and firmware code required by the controller. Memory is a key element of the program module.

After the data is formatted by the controller, it is passed to the IR (infrared or light) communication module where is it converted to light and transmitted through the air with a LED. The LED projects the light through the air in a pattern pre-determined by the physical shape and electrical properties of the LED.

The powerline communication system (b) contains a controller that accepts information in the form of data from a switch and a source. The data from the switch might contain on/off control information or strobe or dimmer information. The data from the source might contain cable or satellite set top box video and audio information or a digital data stream from a DVD or CD player or it might even contain information from a PC or internet streaming device such as an Apple TV or Roku entertainment device.

The controller formats the data and provides Media Access Control (MAC) and physical layer (PHY) processing. These MAC and PHY functions may include filtering, modulation, coding, carrier detection, framing, automatic gain control and error correction. The program module stores the software and firmware code required by the controller. Memory is a key element of the program module.

After the data is formatted by the controller, it is passed to the power line communication module where is it converted to an analog signal and transmitted over the power line interface. The power line interface conditions and then couples the transmitted signal to the power line while rejecting the 120 VAC (or 240 VAC in other countries).

Communication means other than RF, light or power line could be used for communication between LED light bulbs and the wall switch controller. Each has its advantage and disadvantage.

Figure 16E:
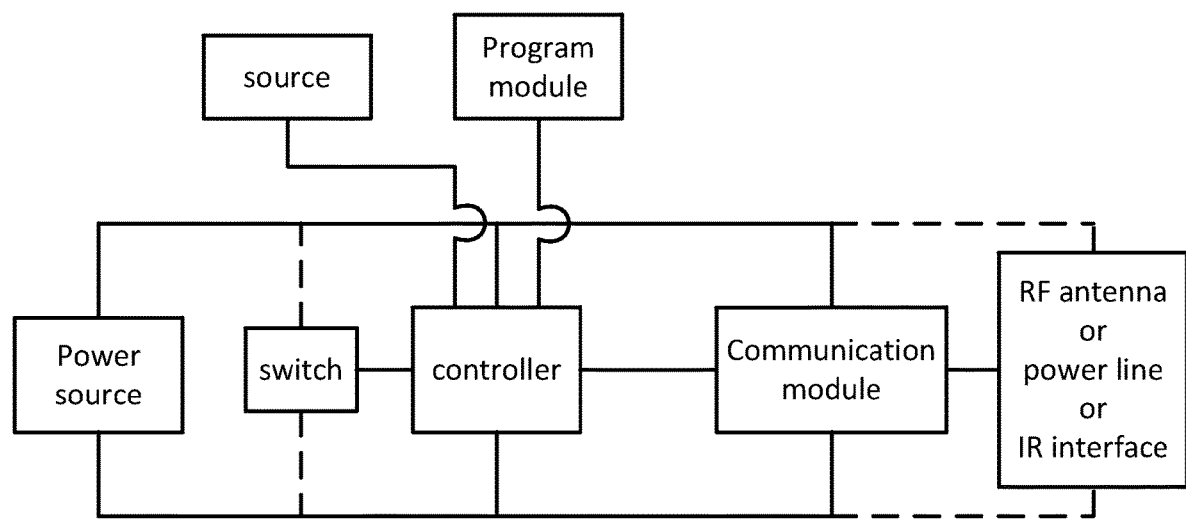
FIG. 16E illustrates an embodiment of an LED light controller constructed according the present invention that supports communications with remote devices.

FIG. 16E illustrates an embodiment of an LED light controller constructed according the present invention that supports communications with remote devices. The wall switch module connects to a power source (120 VAC mains, battery or conditioned supply), switch source, controller, program module, communication module and interface as shown if FIG. 16E. The interface provides impedance match and signal conditioning to the transmission media. The communication module provides modulation, error correction and formatting of the data before sending to the interface. The controller, by executing the program stored in the program module, provides functions such as MAC, encryption and device pairing before sending the data from the switch and source to the communication module. The power source provides power to all blocks in the system that requires power.

Figure 16F:
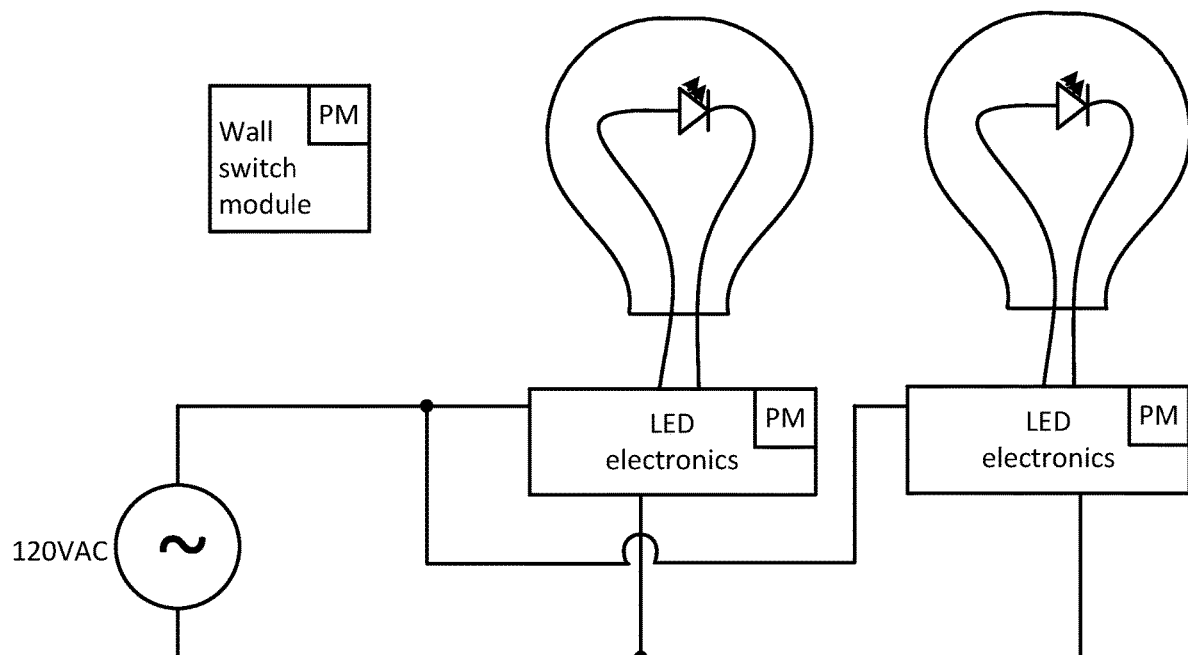
FIG. 16F illustrates an LED light constructed according to an embodiment of the present invention having LED electronics respective to multiple LED bulbs and a wall mounted switch configured control the LED light paired therewith.

FIG. 16F illustrates an LED light constructed according to an embodiment of the present invention having LED electronics respective to multiple LED bulbs and a wall mounted switch configured control the LED light paired therewith. It is necessary to pair all devices in a lighting network before control or communication can begin. To facilitate this, a pairing function must be included in the wall switch module and each LED electronic device as shown in FIG. 16F. Pairing can be manual, like a garage door opener with remote, or automatic like a PC in a local area network. Each of the LED electronics can be assigned an address or the wall switch module can assign a random address to each LED electronic. The wall switch module manages the pairing of the communication network and the LED electronics serve the wall switch module pairing commands. In one preferred embodiment, pairing takes place the first time power is applied to the wall switch module. From then on pairing is updated each time a new LED electronics is activated within the communication range of the wall switch module. If an LED electronic loses its pairing, the wall switch module will attempt to repair the lost device or the entire network of LED electronics. Other pairing schemes are possible that will ensure that all associated LED electronics are maintained in the network at all times.

Figure 1:
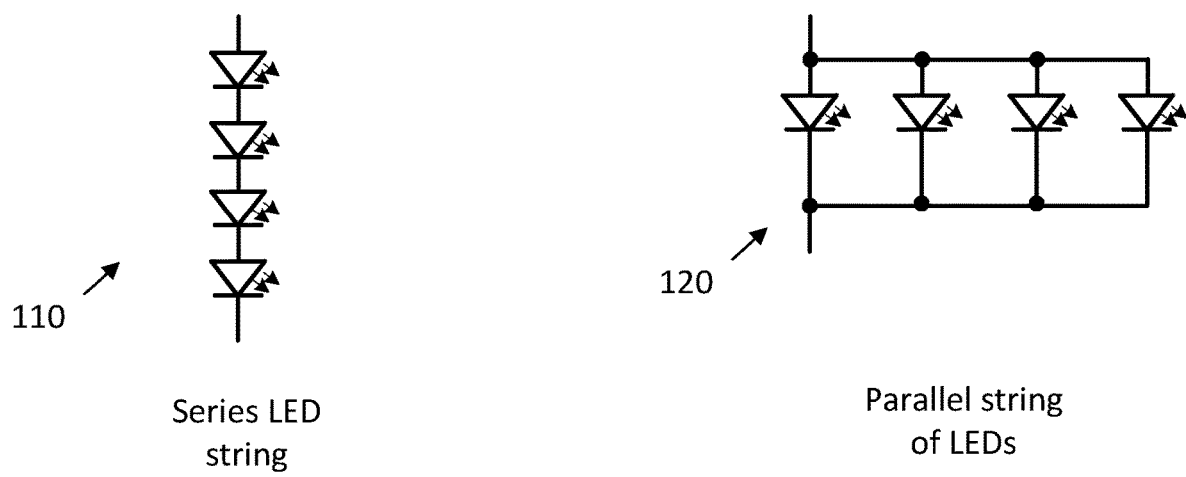
FIG. 1 illustrates prior art LED strings and LED arrangements.
Figure 2:
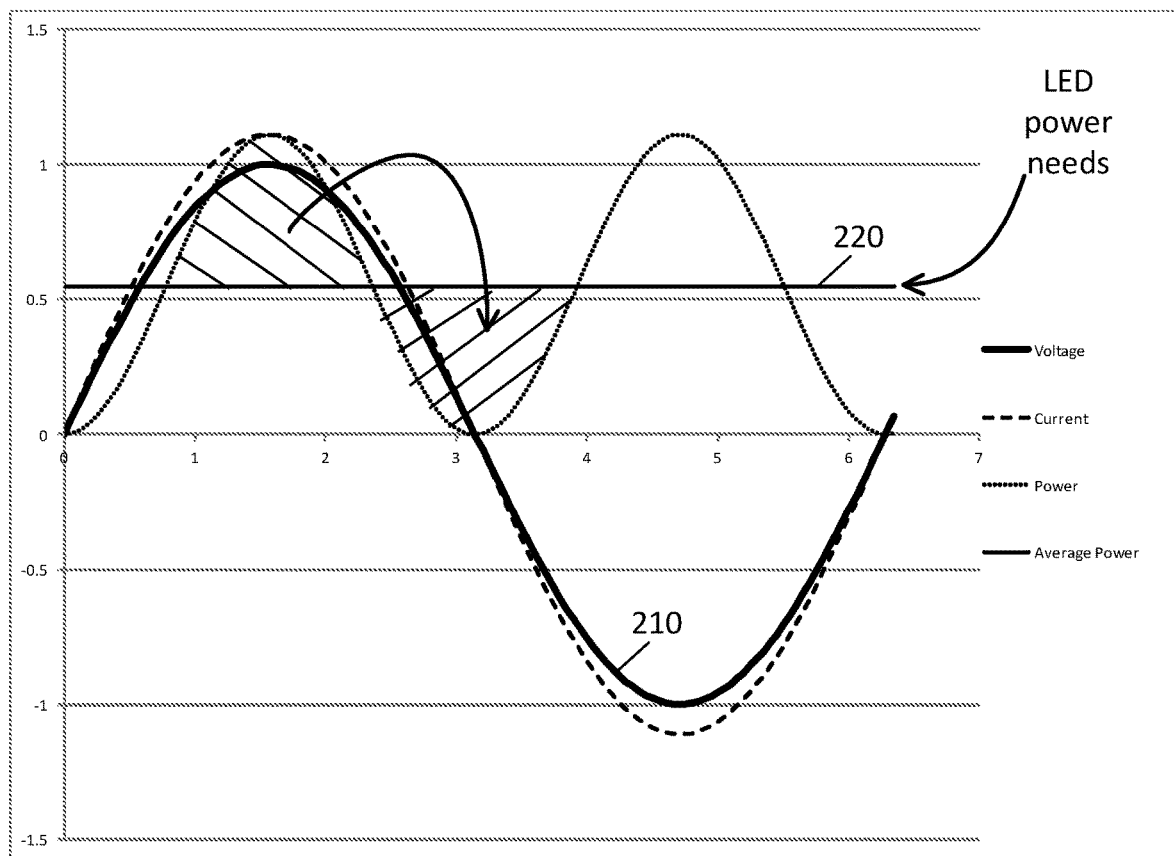
FIG. 2 is a graph illustrating an alternating current cycle along with LED power needs graphed therewith.

FIG. 16F1 illustrates a ceiling mounted LED light constructed according to an embodiment of the present invention with a remote control. FIG. 16F2 illustrates an LED light constructed according to an embodiment of the present invention with a remote control. FIG. 16F3 illustrates an LED light constructed according to another embodiment of the present invention with a remote control. LED lighting, rechargeable batteries and solar cells (photovoltaic cells) are becoming so efficient that an LED light bulb will operate 24 hours a day without being connected to the power mains. FIGS. 16F1, 16F2, and 16F3 show systems that are capable of this. During the day, the solar cells produce power from ambient light to operate the LED light bulb and to charge the battery. The control and charging electronics (CCE) manages this function. During the night, the rechargeable battery will supply power for the light. To control the on/off state of the light, a remote control is used to modulate the current produced by the solar cells. The CCE demodulate information sent from the remote and control the state of the LED light bulb.

During the day, the solar cells produce a DC current Idc from the ambient light and, when the remote control is activated, a modulated current Iac is created as shown in FIG. 16F2. The CCE charges the battery from the Idc and demodulates Iac to determine the desired state of the LED light bulb. Idc is used to power the light bulb. At night, Idc=0 amps requiring all power to come from the battery. Iac however, continues to determine the state of the LED light bulb.

In a wireless power system using an alternative embodiment of the invention, constant light plus modulated light is sent from a remote device to create both Idc and Iac as shown in FIG. 16F3. In this way, power is derived without wires, from the remote control. This embodiment will function at night and eliminates the need for a battery. Normally, the remote control would not be a handheld device, although it could be, but a device that is fixed in location, receiving power from a wire. One application might be decorative lighting, to prevent running wires up to a temporary overhead light. Another application might be a road sign that illuminates at night from the headlights of a car. Since remote road signs have no power source, the headlights of the car produce Idc and can be modulated to create Iac if control information is desired.

Figure 16G:
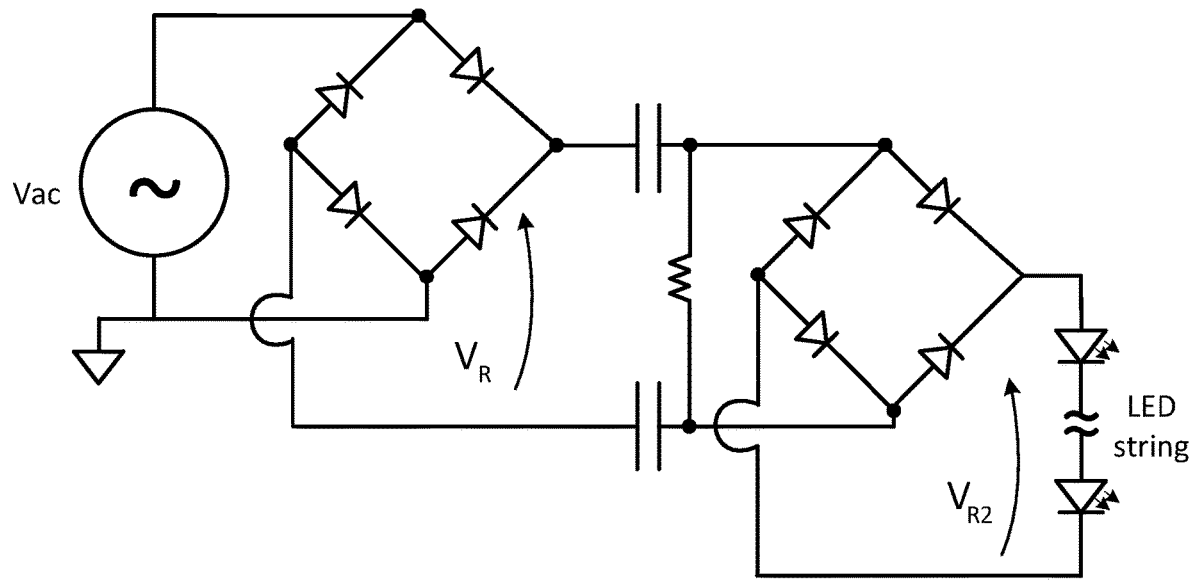
FIG. 16G illustrates an LED light constructed according to an embodiment of the present invention with multiple wave rectification circuits.
Figure 16G:
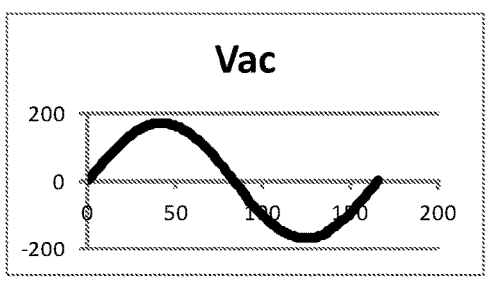
Figure 16G:
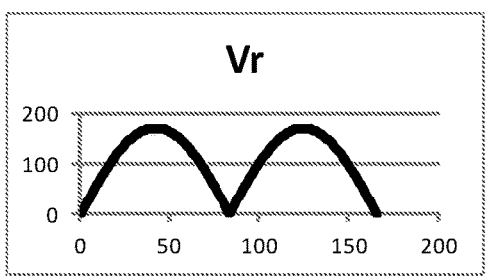
Figure 16G:
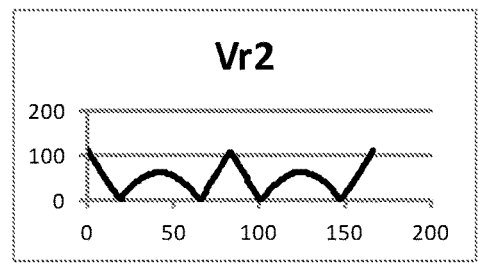

FIG. 16G illustrates an LED light constructed according to an embodiment of the present invention with multiple wave rectification circuits. Double bridge rectification can be used to reduce perceived flicker in the system as shown in FIG. 16G. Though single bridge rectification reduces the flicker by a factor of two by increasing the flicker rate from 60 Hz to 120 Hz, double bridge rectification reduces flicker by another factor of two by increasing the flicker rate to 240 Hz. In addition, double bridge rectification significantly reduces the peak to average voltage seen by the LED string. An AC coupling circuit is required for this circuit to function properly. In this preferred embodiment, and RC filter for AC coupling is used.

Figure 16H:
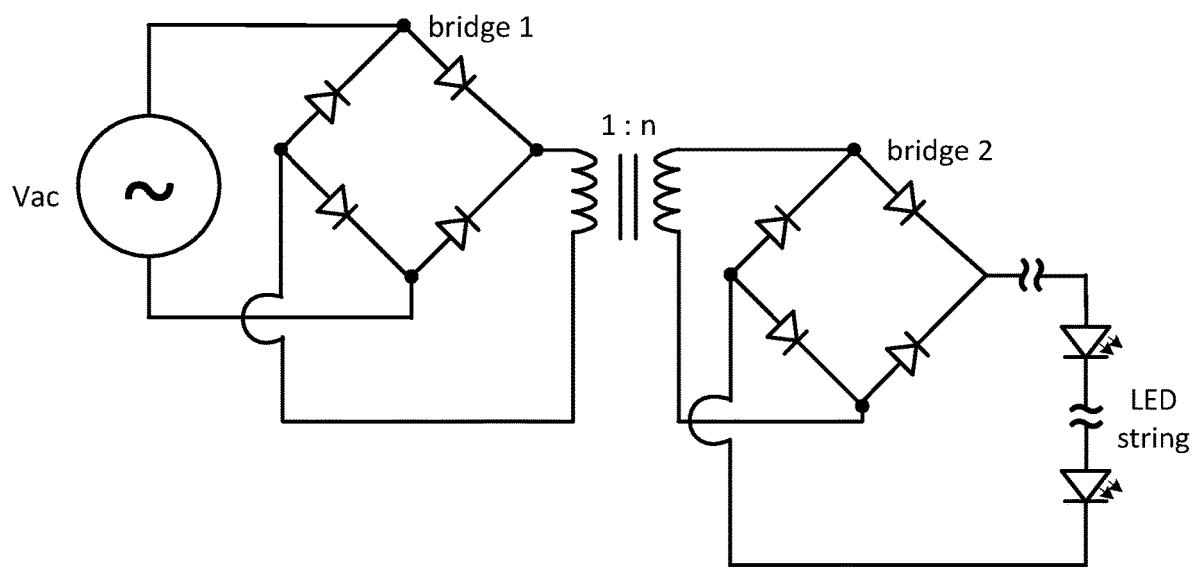
FIG. 16H illustrates an LED light constructed according to another embodiment of the present invention with multiple wave rectification circuits coupled via transformer.

FIG. 16H illustrates an LED light constructed according to another embodiment of the present invention with multiple wave rectification circuits coupled via transformer. A transformer can be used to AC couple the two bridge rectifiers as shown in FIG. 16H. In this embodiment, the transformer has a 1:n turns ratio where n=1. Any other turns ratio that would benefit the overall performance of the design could be used. Triple, quadruple and higher order bridge rectification are also conceivable for powering the LED string.

Figure 16I:
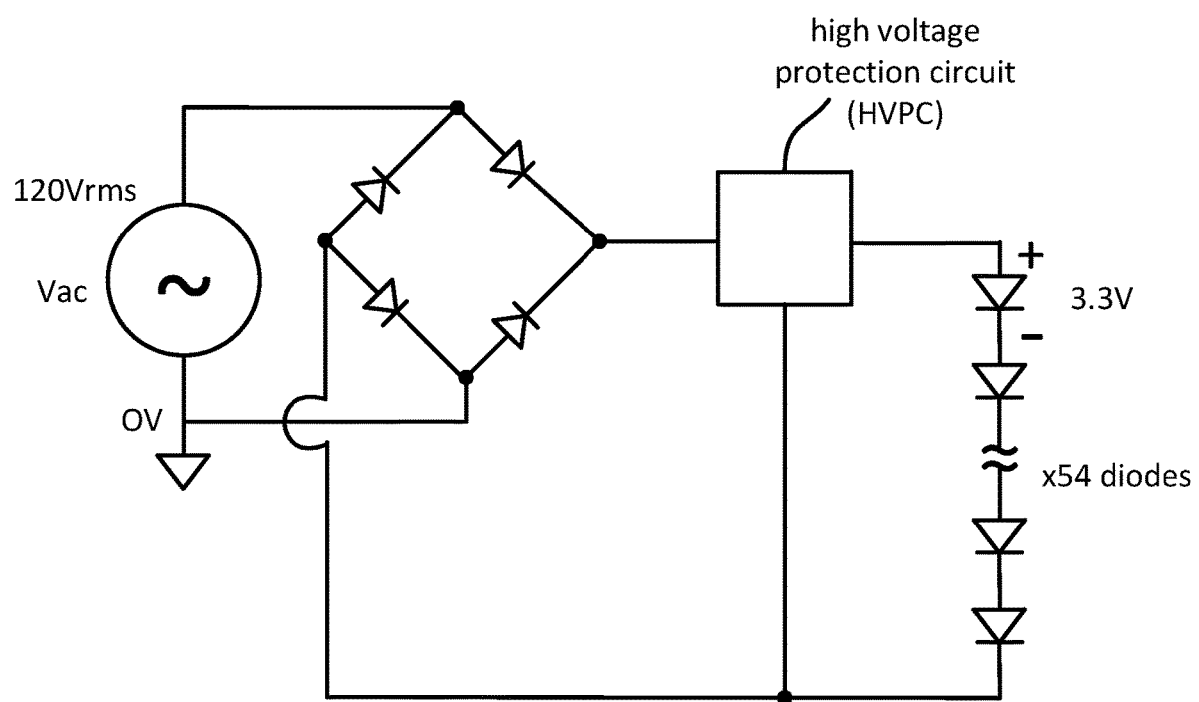
FIG. 16I illustrates an LED light constructed according to an embodiment of the present invention having a high voltage protection circuit.

FIG. 16I illustrates an LED light constructed according to an embodiment of the present invention having a high voltage protection circuit. Surge protection or high voltage protection must be used to prevent the LED strings from being damaged in the event of lightning or perturbations in the power supply. One such way to protect the LED string is to use a high voltage protection circuit as shown in FIG. 16I. If a high voltage event passes through the bridge rectifier, it will be shunted to ground and dissipated as heat in the high voltage protection circuit. This will protect the LED string, but not the bridge rectifier. The bridge rectifier is less sensitive to high voltage events than the LED string, so this type of high voltage protection will be suitable in many applications.

Figure 16J:
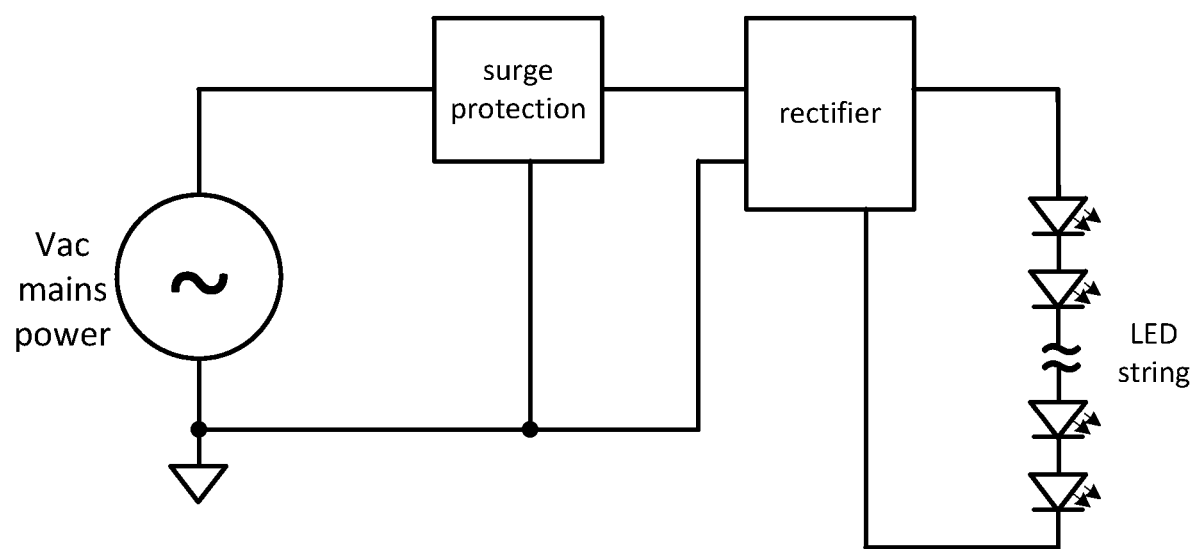
FIG. 16J illustrates an LED light constructed according to an embodiment of the present invention having a surge protection circuit.

FIG. 16J illustrates an LED light constructed according to an embodiment of the present invention having a surge protection circuit. The high voltage protection circuit or surge protection circuit can be added before the rectifier as shown in FIG. 16J. With this placement of the surge protector, both the rectifier and the LED string are protected from unwanted and harmful high voltages and surges. In this placement of the surge protector, the surge protector must be more robust, because it must deal with the higher voltages and more electrically hostile environment of the mains power supply. This is likely to increase the cost of the surge protection portion of the LED light bulb.

Figure 16K:
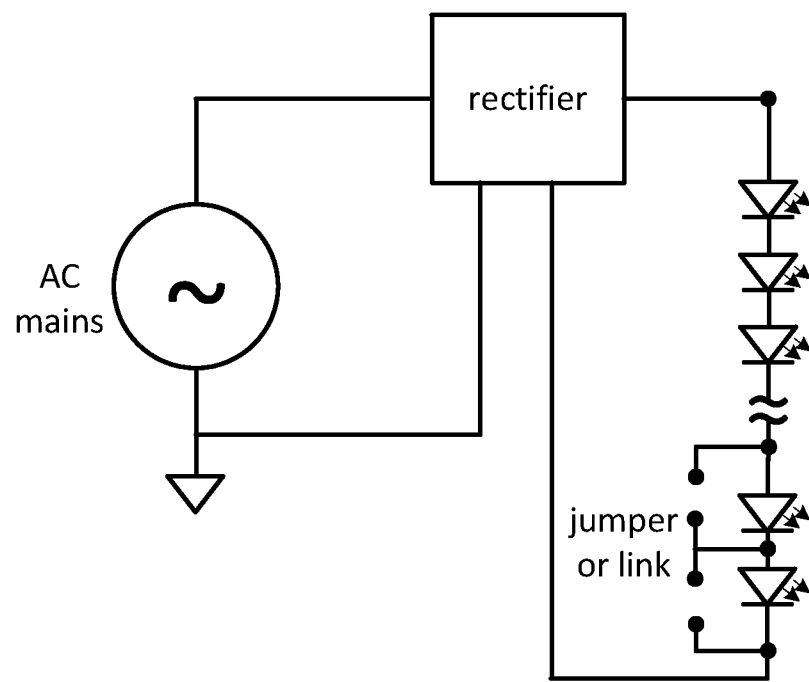
FIG. 16K illustrates an LED light constructed according to an embodiment of the present invention having LED bulbs accessible via jumper.

FIG. 16K illustrates an LED light constructed according to an embodiment of the present invention having LED bulbs accessible via jumper. When manufacturing an LED light bulb based on the series LED string, jumpers can be used to tune the length of the LED string to make up for the make tolerance of the LEDs. One such design based on this technique is shown in FIG. 16K. In the factory, the maximum number of LEDs that will be used are installed in the LED light bulb. Humans or machines then install the appropriate number of jumpers to accommodate the make tolerance of the LEDs. This can be done while electrically testing the LED light bulb or through advance knowledge of the make tolerance of the LEDs that have been installed. In this way, the brightness of the LED light bulb can be tuned to the desired intensity level in the factory.

Figure 16L:
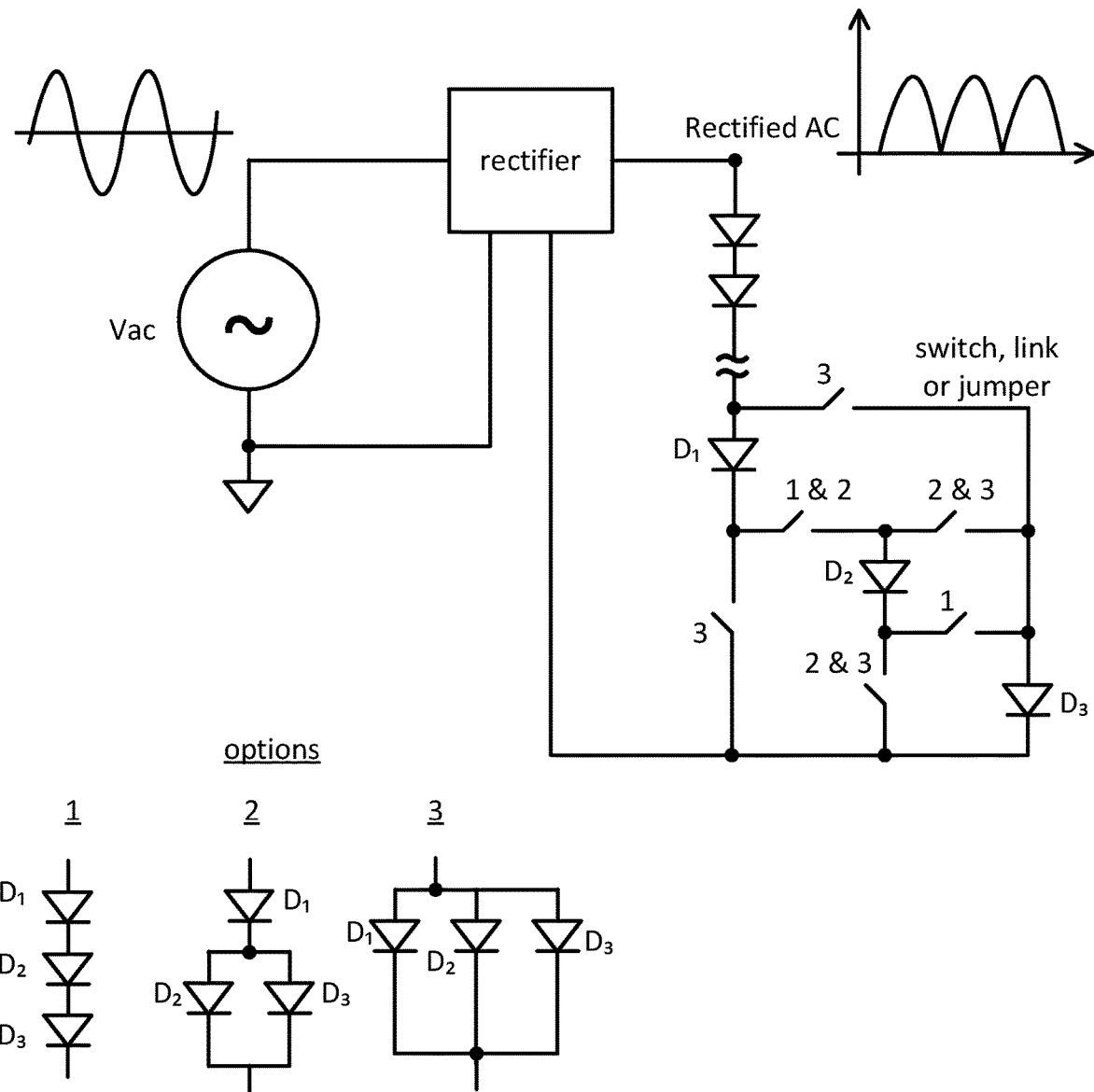
FIG. 16L illustrates an LED light constructed according to an embodiment of the present invention having differing LED bulb connection options.

FIG. 16L illustrates an LED light constructed according to an embodiment of the present invention having differing LED bulb connection options. Another way to adjust the length of the LED string to correct for manufacturing tolerance of the LEDs is shown in FIG. 16L. This circuit allows the three LEDs at the bottom to be connected in series, parallel, or a series/parallel combination through the use of switches or jumpers. The three connection options that this preferred embodiment allows are shown to the left of the circuit diagram. Any number of jumpers could be used to connect any number of diodes in any series, parallel, series/parallel or LED shorting scheme to adjust the LED sting impedance to correct for manufacturing tolerances of the LEDs.

Since some of the circuitry disclosed here make use of large numbers of LED diodes arranged in an electrical string, it would also be useful to disclose circuitry applicable to the manufacturing of such LED strings.

Much current research is ongoing to determine how to output higher levels of light from a single LED diode, and at higher levels of efficiency. Improvements in this area can be combined with the circuitry disclosed here, in order to create devices that combine higher levels of light out and multiple LED diodes in a single device. If N multiple series connected LED diodes were created in a single device, each LED device could be 1/N times the size of the LED diode in a conventional LED device, and output 1/N times as much light, but with N diodes in series, the total light output would remain constant.

Figure 17:
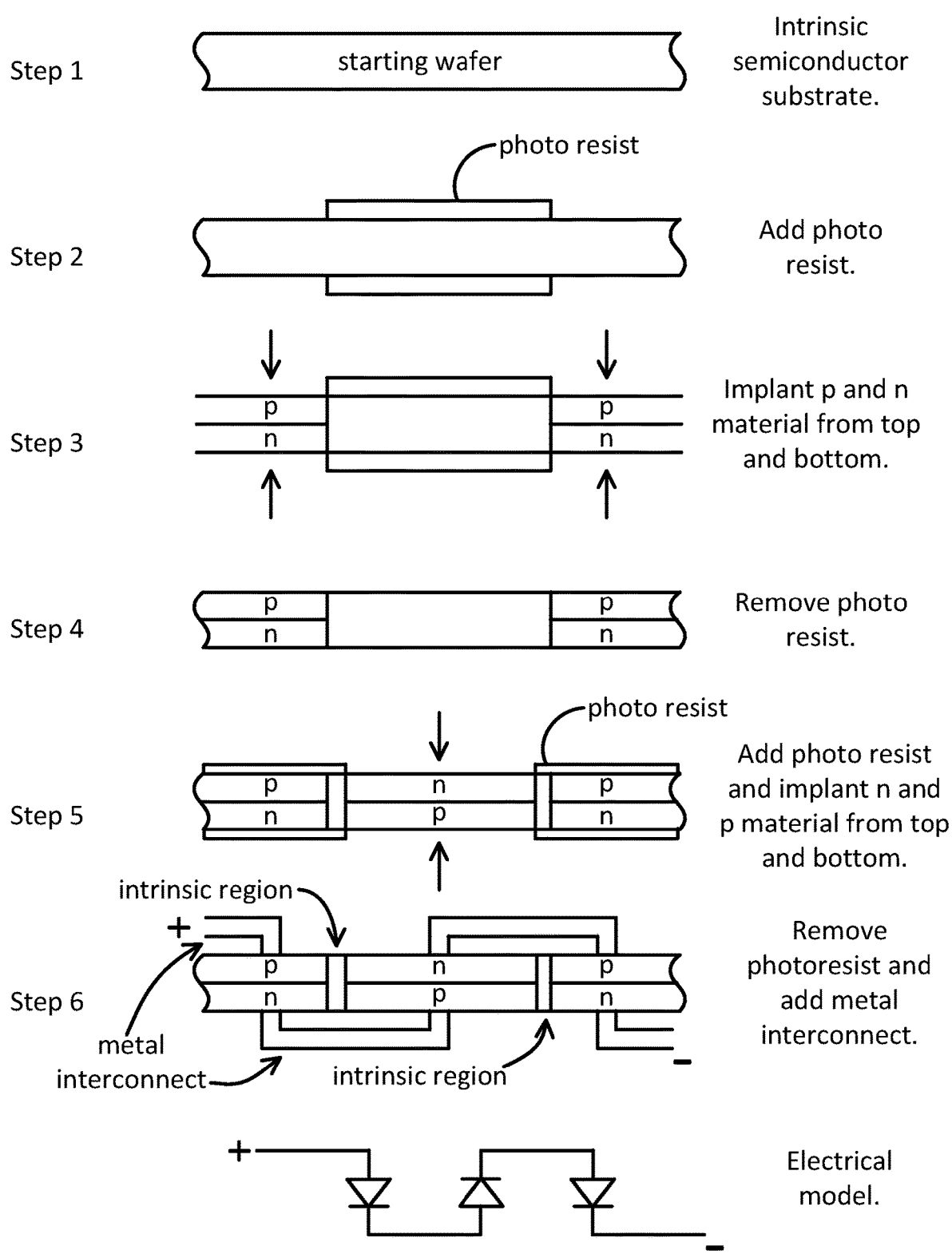
FIG. 17 illustrates an LED light string constructed according to an embodiment of the present invention in a multiple layer semi conductive substrate.

FIG. 17 illustrates an LED light string constructed according to an embodiment of the present invention in a multiple layer semi conductive substrate. One approach to doing this would be to manufacture multiple diodes on a single piece of silicon as shown in FIG. 17. Intrinsic silicon does not conduct electricity very well, especially at lower temperatures. An intrinsic silicon wafer or one that has been lightly doped with p-type or n-type impurities could be implanted with heavy doses of P-type and N-type impurities from both sides as shown, in order to make a series of LED diodes as shown in FIG. 17, which can then be connected in series using conductors deposited on each side of the silicon wafer. FIG. 17 shows the fabrication process and a cross section of such a device.

Figure 17A:
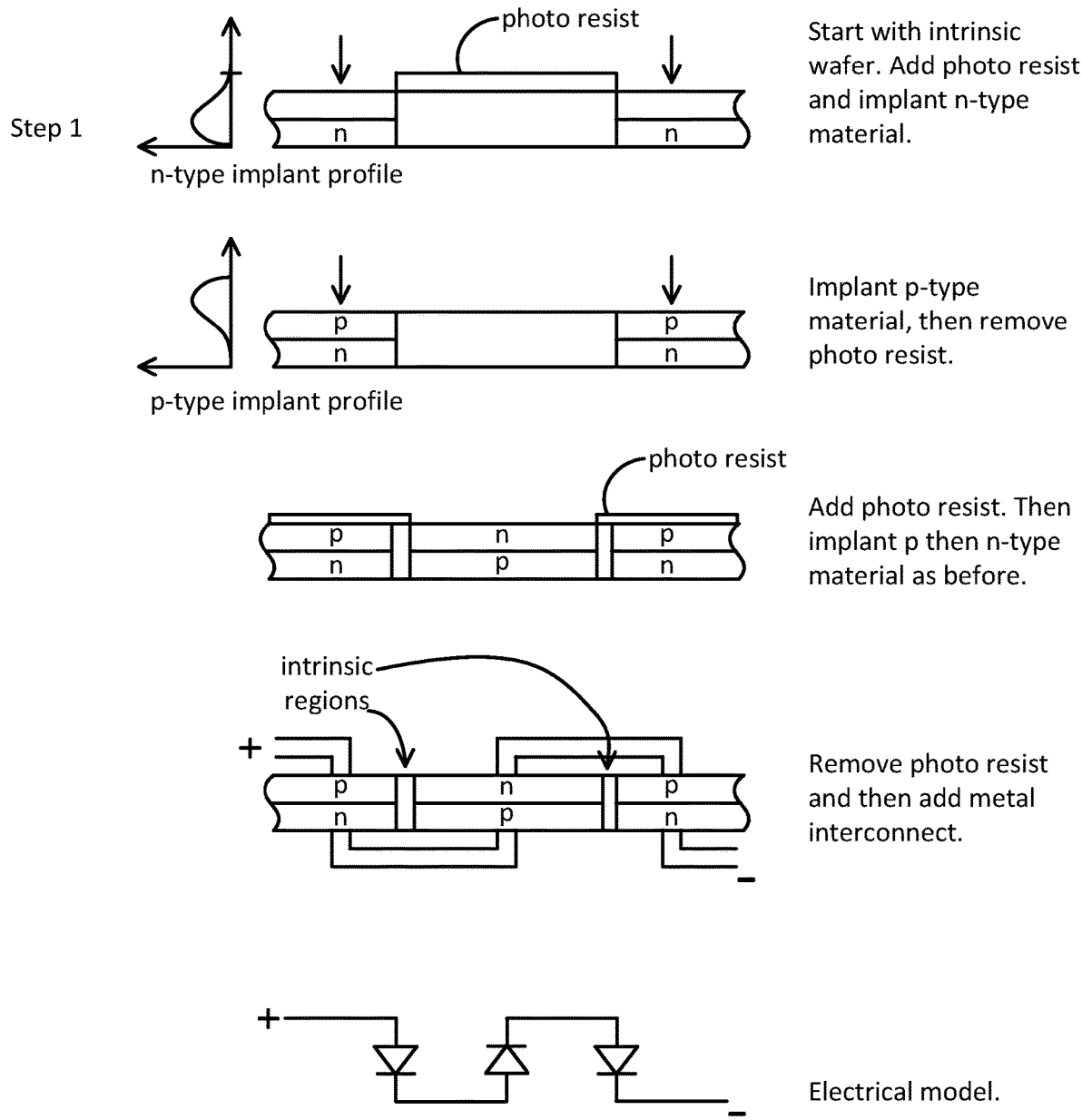
FIG. 17A illustrates an LED light string constructed according to another embodiment of the present invention in a multiple layer semi conductive substrate.

FIG. 17A illustrates an LED light string constructed according to another embodiment of the present invention in a multiple layer semi conductive substrate. Implanting both sides of the wafer in undesirable, so an alternative fabrication technique could be used. FIG. 17A uses a deep implant for the bottom layer (n-type in this example) and a shallow implant for the top layer (p-type in this example. This eliminates the need to implant both sides of the wafer. The resulting series string of diodes in FIG. 17A is similar to that shown if FIG. 17.

Figure 18:
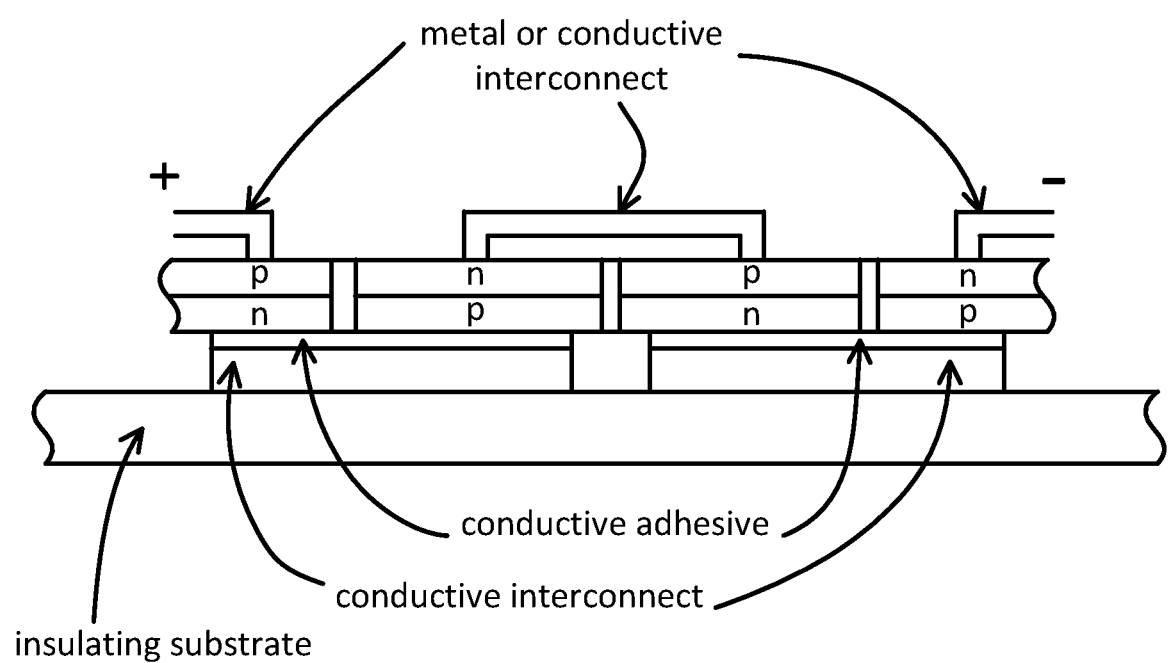
FIG. 18 illustrates an LED light string constructed according to yet another embodiment of the present invention in a multiple layer semi conductive substrate.

FIG. 18 illustrates an LED light string constructed according to yet another embodiment of the present invention in a multiple layer semi conductive substrate. An alternative manufacturing approach is shown in FIG. 18. Interconnects can be deposited on one side of the wafer as before, but the connections on the other side of the wafer could be made via the substrate that the LED is mounted upon. If the resistance of the intrinsic silicon proves too high, or if it is preferred to manufacture the LED diodes using an N-type or P-type wafer, then an alternate manufacturing approach can be used as shown in FIG. 19.

Figure 19:
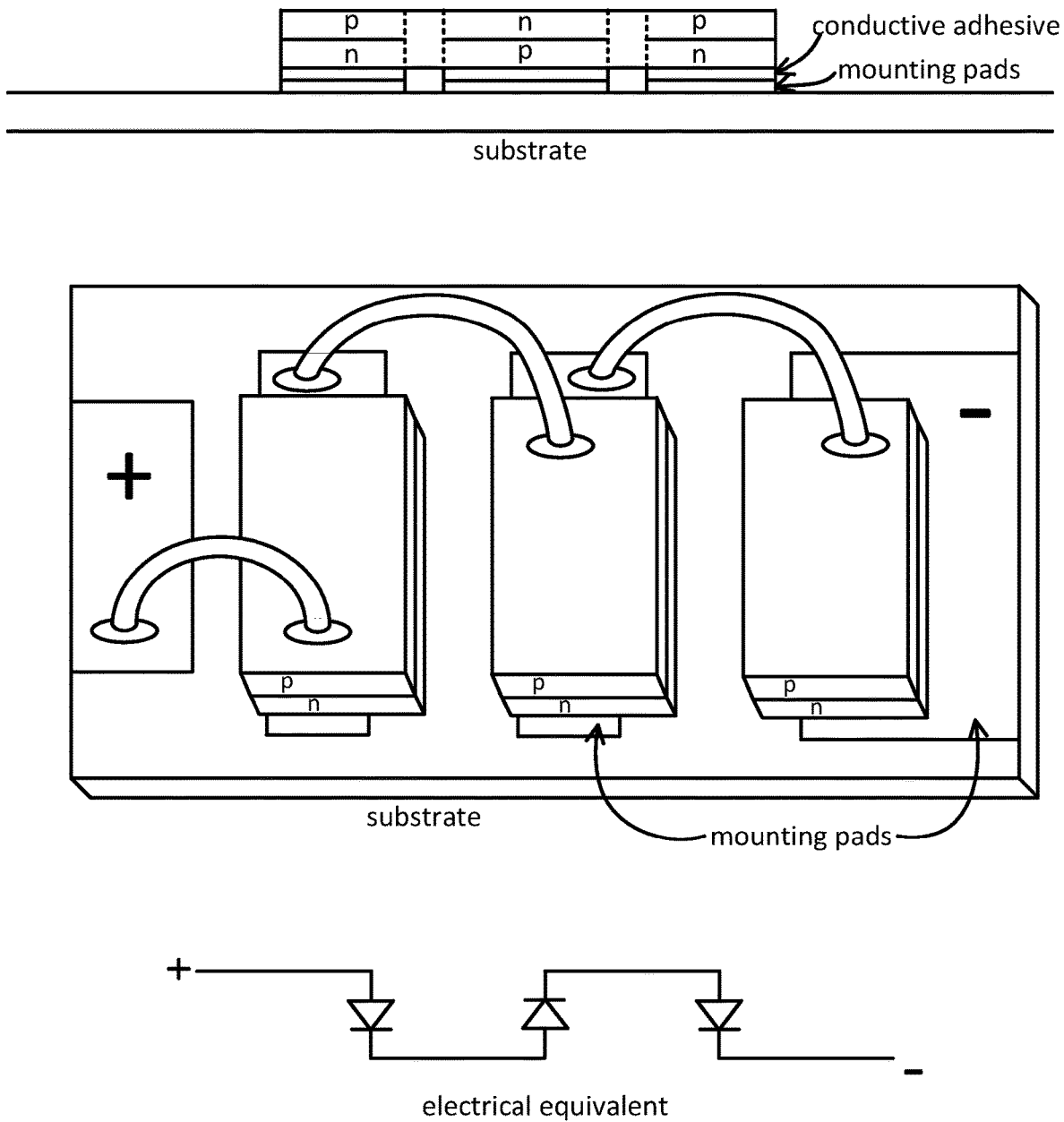
FIG. 19 illustrates an LED light string constructed according to yet another embodiment of the present invention in a multiple layer semi conductive substrate.

FIG. 19 illustrates an LED light string constructed according to yet another embodiment of the present invention in a multiple layer semi conductive substrate. In this case, a slice of silicon with a large area P-N junction is manufactured and then attached to a substrate, then the wafer area between the desired LED diodes is removed using an etching process, or a laser process, leaving free standing LED diodes attached to a substrate. These LED diodes are then connected using wire bonds to create a series of LEDs connected in series on a single substrate. An alternate assembly process would be similar to FIG. 19, except the diodes would be cut into individual pieces before attaching to the substrate.

Figure 20:
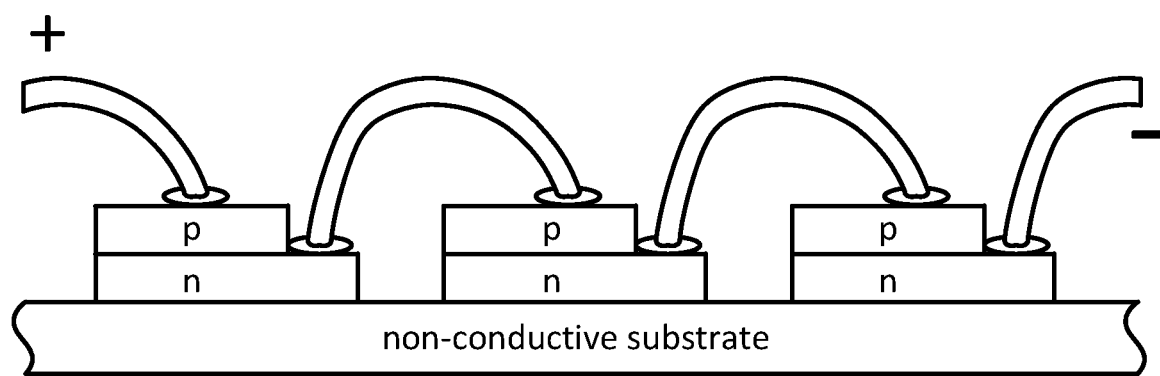
FIG. 20 illustrates an LED light string constructed according to yet another embodiment of the present invention in a multiple layer semi conductive substrate.

FIG. 20 illustrates an LED light string constructed according to yet another embodiment of the present invention in a multiple layer semi conductive substrate. Another manufacturing technique that would allow the use of a fully non-conductive substrate is shown in FIG. 20. A small area of each LED diode would be etched down to a layer below the P-N junction to allow a bonding wire to be attached, allowing the electrical chaining of the LED diodes to be completed from the front side of the original wafer only.

Figure 21:
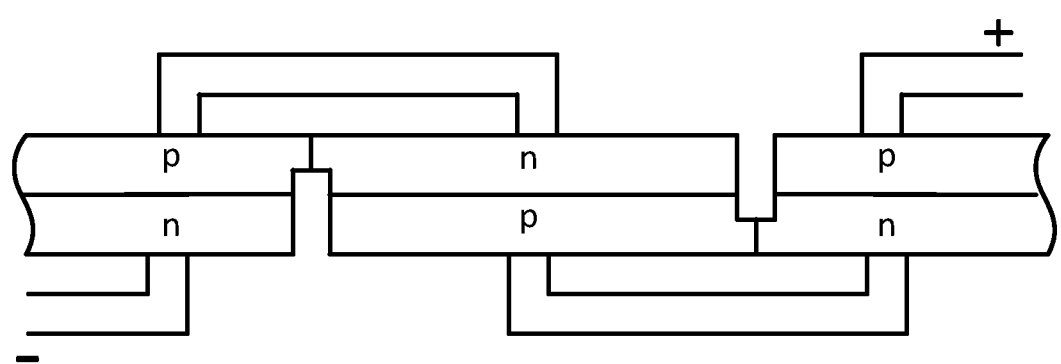
FIG. 21 illustrates an LED light string constructed according to yet another embodiment of the present invention in a multiple layer semi conductive substrate.

FIG. 21 illustrates an LED light string constructed according to yet another embodiment of the present invention in a multiple layer semi conductive substrate. In FIG. 21 narrow channels are etched into the wafer on both sides to eliminate P-N junctions that are not desired. Combining this technique with conductive wires attached on both sides of the wafer, we can again create a string of LED diodes from a single piece of silicon.

Figure 22:
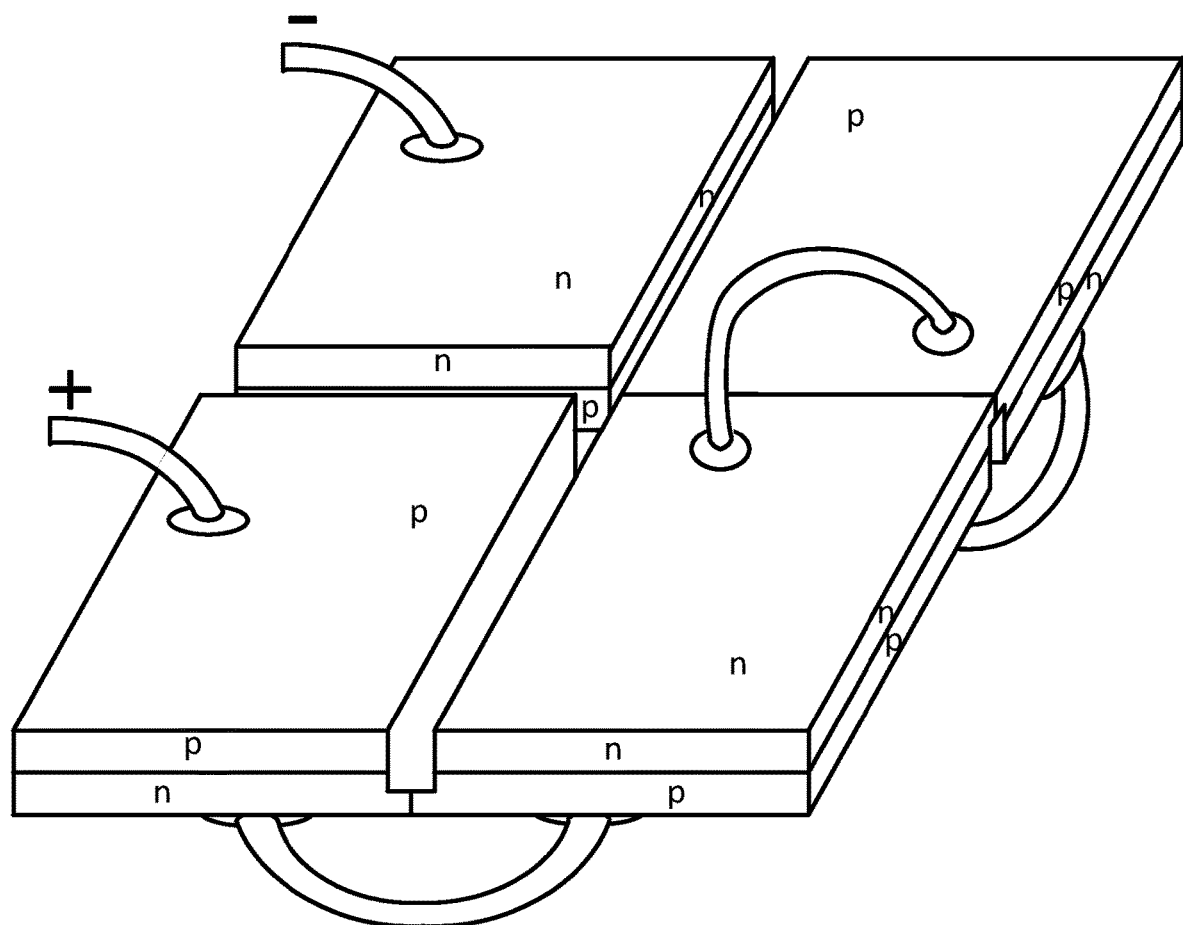
FIG. 22 illustrates an LED light string constructed according to yet another embodiment of the present invention in a multiple layer semi conductive substrate.

While FIG. 21 shows a side view of such a device, a 2 dimensional matrix of LED devices may be formed on the surface of a wafer, allowing LED diodes to be created with simultaneous large surface area for large light output levels divided into a large number of LED diodes connected in a series string, as shown in FIG. 22, which illustrates an LED light string constructed according to yet another embodiment of the present invention in a multiple layer semi conductive substrate.

The terms "circuit" and "circuitry" as used herein may refer to an independent circuit or to a portion of a multi-functional circuit that performs multiple underlying functions. For example, depending on the embodiment, processing circuitry may be implemented as a single chip processor or as a plurality of processing chips. Likewise, a first circuit and a second circuit may be combined in one embodiment into a single circuit or, in another embodiment, operate independently perhaps in separate chips. The term "chip," as used herein, refers to an integrated circuit. Circuits and circuitry may comprise general or specific purpose hardware, or may comprise such hardware and associated software such as firmware or object code.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to." As may even further be used herein, the term "operable to" indicates that an item includes one or more of power connections, input(s), output(s), etc., to perform one or more its corresponding functions and may further include inferred coupling to one or more other items. As may still further be used herein, the term "associated with," includes direct and/or indirect coupling of separate items and/or one item being embedded within another item. As may be used herein, the term "compares favorably," indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention.

What is claimed is:

1. A system configured to interface with a series connected Light Emitting Diode (LED) string having a primary group of LEDs and a secondary group of LEDs, a first LED drive input connected to a first side of the primary group of LEDs, a second LED drive input connected to a second side of the primary group of LEDs and to a first side of the secondary group of LEDs, and a third LED drive input connected to a secondary side of the secondary group of LEDs, the system comprising:
    a bridge rectifier configured to convert an alternating current power input to a rectified output;
    a control circuit coupled on a first side to the rectified output and on a second side to ground;
    a first LED drive circuit having a first input coupled to the rectified output, a first drive output coupled to the first LED drive input and a second drive output coupled to the second LED drive input, the first LED drive circuit configured to shunt the first drive output to the second drive output based upon a voltage of the rectified output; and
    a second LED drive circuit having a second input coupled to the second drive output, a third drive output coupled to the second LED drive input and a fourth drive output coupled to the third LED drive input, the second LED drive circuit configured to shunt the third drive output to the fourth drive output based upon the voltage of the rectified output.

2. The system of claim 1, wherein the first LED drive circuit comprises a first integrated circuit.

3. The system of claim 2, wherein the second LED drive circuit comprises a second integrated circuit.

4. The system of claim 1, further comprising a communication module.

5. The system of claim 4, wherein the communication module supports Radio Frequency (RF) communications.

6. The system of claim 4, wherein the communication module supports communications with at least one computing device.

7. The system of claim 6, wherein the control circuit is configured to control operation of the series connected LED string based upon the communications with the at least one computing device.

8. A system configured to interface with a series connected Light Emitting Diode (LED) string having a primary group of LEDs and a secondary group of LEDs, a first LED drive input connected to a first side of the primary group of LEDs, a second LED drive input connected to a second side of the primary group of LEDs and to a first side of the secondary group of LEDs, and a third LED drive input connected to a secondary side of the secondary group of LEDs and to a bridge rectifier configured to convert an alternating current power input to a rectified output, the system comprising:
    a control circuit coupled on a first side to the rectified output and on a second side to ground;
    a first LED drive circuit having a first input coupled to the rectified output, a first drive output coupled to the first LED drive input and a second drive output coupled to the second LED drive input, the first LED drive circuit configured to shunt the first drive output to the second drive output based upon a voltage of the rectified output; and
    a second LED drive circuit having a second input coupled to the second drive output, a third drive output coupled to the second LED drive input and a fourth drive output coupled to the third LED drive input, the second LED drive circuit configured to shunt the third drive output to the fourth drive output based upon the voltage of the rectified output.

9. The system of claim 8, wherein the first LED drive circuit comprises a first integrated circuit.

10. The system of claim 9, wherein the second LED drive circuit comprises a second integrated circuit.

11. The system of claim 8, further comprising a communication module.

12. The system of claim 11, wherein the communication module supports Radio Frequency (RF) communications.

13. The system of claim 11, wherein the communication module supports communications with at least one computing device.

14. The system of claim 13, wherein the control circuit is configured to control operation of the series connected LED string based upon the communications with the at least one computing device.

15. A system configured to interface with a series connected Light Emitting Diode (LED) string having a group of unswitched LEDs, a primary group of LEDs and a secondary group of LEDs, a first LED drive input connected to a first side of the primary group of LEDs, a second LED drive input connected to a second side of the primary group of LEDs and to a first side of the secondary group of LEDs, and a third LED drive input connected to a secondary side of the secondary group of LEDs and to a bridge rectifier configured to convert an alternating current power input to a rectified output, the system comprising:
    a control circuit coupled on a first side to the rectified output and on a second side to ground;
    a first LED drive circuit having a first input coupled to the rectified output via the group of unswitched LEDs, a first drive output coupled to the first LED drive input and a second drive output coupled to the second LED drive input, the first LED drive circuit configured to shunt the first drive output to the second drive output based upon a voltage of the rectified output; and a second LED drive circuit having a second input coupled to the second drive output, a third drive output coupled to the second LED drive input and a fourth drive output coupled to the third LED drive input, the second LED drive circuit configured to shunt the third drive output to the fourth drive output based upon the voltage of the rectified output.

16. The system of claim 15, wherein the first LED drive circuit comprises a first integrated circuit.

17. The system of claim 16, wherein the second LED drive circuit comprises a second integrated circuit.

18. The system of claim 15, further comprising a communication module.

19. The system of claim 18, wherein the communication module supports communications with at least one computing device.

20. The system of claim 19, wherein the control circuit is configured to control operation of the series connected LED string based upon the communications with the at least one computing device.

* * * * *